(12) United States Patent
Lee et al.

(10) Patent No.: US 11,217,850 B2
(45) Date of Patent: Jan. 4, 2022

(54) FRAME ASSEMBLY AND METHOD FOR MANUFACTURING SAME

(71) Applicant: Yura Corporation Co., Ltd., Gyeonggi-do (KR)

(72) Inventors: Cheon Hyo Lee, Gyeonggi-do (KR); Kwang Ouk Sa, Seoul (KR)

(73) Assignee: Yura Corporation Co., Ltd., Gyeonggi-do (KR)

( * ) Notice: Subject to any disclaimer, the term of this patent is extended or adjusted under 35 U.S.C. 154(b) by 156 days.

(21) Appl. No.: 16/489,229

(22) PCT Filed: Nov. 24, 2017

(86) PCT No.: PCT/KR2017/013562
§ 371 (c)(1),
(2) Date: Aug. 27, 2019

(87) PCT Pub. No.: WO2018/159928
PCT Pub. Date: Sep. 7, 2018

(65) Prior Publication Data
US 2020/0014005 A1 Jan. 9, 2020

(30) Foreign Application Priority Data

Feb. 28, 2017 (KR) .................. 10-2017-0026828
Oct. 27, 2017 (KR) .................. 10-2017-0141526

(51) Int. Cl.
*H01M 2/10* (2006.01)
*H01M 50/20* (2021.01)
(Continued)

(52) U.S. Cl.
CPC ............ *H01M 50/20* (2021.01); *F16M 11/22* (2013.01); *H01M 10/425* (2013.01);
(Continued)

(58) Field of Classification Search
CPC .. H01M 50/20; H01M 50/502; H01M 10/425; H01M 2010/4271;
(Continued)

(56) References Cited

U.S. PATENT DOCUMENTS 9,147,875 B1 * 9/2015 Coakley ................ H01M 10/48
9,893,519 B1 * 2/2018 Castillo ..................... H01G 2/02
(Continued)

FOREIGN PATENT DOCUMENTS

CN 102308433 A 1/2012
CN 102379058 A 3/2012
(Continued)

OTHER PUBLICATIONS

International Search Report issued in PCT Patent Application No. PCT/KR2017/013561 dated May 31, 2018.
(Continued)

*Primary Examiner* — Michael L Dignan
(74) *Attorney, Agent, or Firm* — Marshall, Gerstein & Borun LLP

(57) ABSTRACT

Provided is a frame assembly for fixing a plurality of stacked battery cells. The frame assembly may include: a frame including an upper surface, a first side surface connected to a first end of the upper surface and a second side surface connected to a second end of the upper surface, the frame being configured to enclose the plurality of battery cells; a plurality of first bus bars disposed on the first side surface; a plurality of second bus bars disposed on the second side surface; and a flexible printed circuit board disposed along the upper surface, the first side surface, and the second side surface of the frame, the flexible printed circuit board being configured to sense the plurality of battery cells.

16 Claims, 19 Drawing Sheets

(51) Int. Cl.
  *F16M 11/22*  (2006.01)
  *H01M 10/42*  (2006.01)
  *H05K 1/02*   (2006.01)
  *H05K 1/18*   (2006.01)
  *H05K 3/00*   (2006.01)
  *H05K 3/04*   (2006.01)
  *H05K 3/18*   (2006.01)
  *H01M 50/502* (2021.01)
  *B60L 50/64*  (2019.01)

(52) U.S. Cl.
  CPC .......... *H01M 50/502* (2021.01); *H05K 1/028* (2013.01); *H05K 1/189* (2013.01); *H05K 3/0044* (2013.01); *H05K 3/04* (2013.01); *H05K 3/18* (2013.01); *B60L 50/64* (2019.02); *H01M 2010/4271* (2013.01); *H01M 2220/20* (2013.01); *H05K 2201/10037* (2013.01); *H05K 2201/10272* (2013.01); *H05K 2201/10424* (2013.01); *H05K 2203/0228* (2013.01)

(58) Field of Classification Search
  CPC ............ H01M 2220/20; H01M 10/482; F16M 11/22; H05K 1/028; H05K 1/189; H05K 3/0044; H05K 3/04; H05K 3/18; H05K 2201/10037; H05K 2201/10272; H05K 2201/10424; H05K 2203/0228; H05K 2201/2027; H05K 2201/0195; H05K 2201/0145; H05K 2201/0154; H05K 2201/053; H05K 2201/10151; H05K 2201/10189; H05K 2201/056; H05K 2201/052; H05K 3/284; B60L 50/34
  See application file for complete search history.

(56) References Cited

U.S. PATENT DOCUMENTS

| | | |
|---|---|---|
| 2009/0246627 A1 | 10/2009 | Park |
| 2011/0059342 A1 | 3/2011 | Lee et al. |
| 2012/0019061 A1 | 1/2012 | Nishihara et al. |
| 2012/0214027 A1 | 8/2012 | Ahn |
| 2013/0000957 A1 | 1/2013 | Ikeda et al. |
| 2014/0193680 A1* | 7/2014 | Lee ..................... H01M 10/486 429/82 |
| 2014/0356687 A1 | 12/2014 | Heo et al. |
| 2014/0370343 A1* | 12/2014 | Nomoto ............ H01M 10/4207 429/90 |
| 2014/0370355 A1 | 12/2014 | Byun et al. |
| 2015/0132622 A1* | 5/2015 | Gohl ...................... H01M 50/54 429/90 |
| 2015/0138740 A1* | 5/2015 | Shin ......................... C08J 3/243 361/760 |
| 2016/0248070 A1* | 8/2016 | Ahn .................... H01M 50/502 |
| 2018/0019508 A1 | 1/2018 | Lee et al. |
| 2018/0083662 A1* | 3/2018 | Ahmad ................ H04B 1/3888 |

FOREIGN PATENT DOCUMENTS

| | | | |
|---|---|---|---|
| CN | 104067412 A | 9/2014 | |
| CN | 105684188 A | 6/2016 | |
| EP | 1524717 A2 | 4/2005 | |
| JP | 2012227004 A | 11/2012 | |
| JP | 2013-097894 A | 5/2013 | |
| JP | 5715766 B2 | 5/2015 | |
| KR | 10-2009-0104583 A | 10/2009 | |
| KR | 10-2010-0109857 A | 10/2010 | |
| KR | 10-2011-0057470 A | 6/2011 | |
| KR | 10-2011-0057540 A | 6/2011 | |
| KR | 10-2012-0003432 A | 1/2012 | |
| KR | 10-2012-0005728 A | 1/2012 | |
| KR | 10-2012-0095295 A | 8/2012 | |
| KR | 10-2013-0008136 A | 1/2013 | |
| KR | 10-2013-0025245 * | 3/2013 | ............ H01M 2/34 |
| KR | 10-2013-0025245 A | 3/2013 | |
| KR | 10-2013-0065686 A | 6/2013 | |
| KR | 101329251 B1 | 11/2013 | |
| KR | 101329252 B1 | 11/2013 | |
| KR | 10-2014-0090077 A | 7/2014 | |
| KR | 10-2014-0095660 A | 8/2014 | |
| KR | 10-2014-0137044 A | 12/2014 | |
| KR | 10-2014-0139862 A | 12/2014 | |
| KR | 10-2014-0145923 A | 12/2014 | |
| KR | 10-2015-0050314 A | 5/2015 | |
| KR | 10-2015-0067694 A | 6/2015 | |
| KR | 10-2016-0018982 A | 2/2016 | |
| KR | 10-2016-0044654 A | 4/2016 | |
| KR | 10-2016-0115582 A | 10/2016 | |

OTHER PUBLICATIONS

International Search Report issued in PCT Patent Application No. PCT/KR2017/015594 dated Apr. 24, 2018.

International Search Report issued in PCT Patent Application No. PCT/KR2017/013562 dated Mar. 5, 2018.

European Search Report issued in European Patent Application No. 17898475 dated Feb. 6, 2020.

* cited by examiner

FRAME ASSEMBLY AND METHOD FOR MANUFACTURING SAME

TECHNICAL FIELD

The present disclosure relates to a frame assembly and a method for manufacturing the same.

BACKGROUND

A hybrid vehicle or an electric vehicle may use, as a power source, a secondary battery installed inside the vehicle, and may be used in various fields such as a general-purpose vehicle, a leisure cart, and the like. The hybrid vehicle or the electric vehicle may drive wheels by rotating an electric motor using the electric power from the charged secondary battery. After the secondary battery is discharged, the electric vehicle may charge the secondary battery using external electric power, and the hybrid vehicle may charge the secondary battery by driving an internal combustion engine or using external electric power. In addition, a number of electric vehicle manufacturers are entering the market and the number thereof is steadily increasing.

The secondary battery may be used in the form of a single battery module obtained by clustering of a plurality of battery cells, as well as in the form of a single battery. A plurality of battery modules is connected in series and is installed in the lower part of the vehicle body, thereby generating a high voltage for driving an electric motor corresponding to the output of an internal combustion engine. In addition, when a plurality of battery cells is clustered, the terminals of the respective battery cells may be connected in series or in parallel by a frame assembly.

A flexible printed circuit board (FPCB) is obtained by fabricating a substrate made of a flexible material and coating the substrate with a thin insulating layer. The FPCB is lightweight and space-saving, and thus, thanks to these characteristics, the flexible printed circuit board has recently been employed in various fields. However, since the FPCB is a very thin unlike a general PCB, there is a problem in which the FPCB is easily torn or damaged by an external impact. Thus, various research and development efforts are under way to solve the problem.

SUMMARY

Various embodiments of the present disclosure provide a frame assembly in which a connection circuit of a flexible printed circuit board is directly bonded to a bus bar attached to a frame by any of various bonding methods (e.g., laser welding, ultrasonic bonding, resistance welding, and the like). In addition, various embodiments of the present disclosure provide various structures to strengthen the coupling between the circuit and the bus bar.

In a frame assembly for fixing a plurality of stacked battery cells according to an embodiment of the present disclosure, the frame assembly may include: a frame including an upper surface, a first side surface connected to a first end of the upper surface and a second side surface connected to a second end of the upper surface, the frame being configured to enclose the plurality of battery cells; a plurality of first bus bars disposed on the first side surface of the frame; a plurality of second bus bars disposed on the second side surface of the frame; and a flexible printed circuit board disposed along the upper surface, the first side surface, and the second side surface of the frame, the flexible printed circuit board being configured to sense the plurality of battery cells. The flexible printed circuit board may include a circuit portion disposed on the upper surface, a first connection circuit portion extending from a first end of the circuit portion and coupled to the plurality of first bus bars, and a second connection circuit portion extending from a second end of the circuit portion and coupled to the plurality of second bus bars.

According to an embodiment, a first surface of the first connection circuit portion may be bonded to the plurality of first bus bars, and a first surface of the second connection portion circuit may be bonded to the plurality of second bus bars.

According to an embodiment, the frame may include: a first frame disposed on the upper surface; a second frame disposed on the first lateral surface so as to be pivotably coupled to one end of the first frame and having the plurality of first bus bars disposed therein; and a third frame disposed on the second lateral surface so as to be pivotably coupled to the opposite end of the first frame and having the plurality of second bus bars disposed therein.

According to an embodiment, the plurality of the first bus bars may include a first recess configured to seat the first connection circuit portion therein, and the plurality of second bus bars may include a second recess configured to seat the second connection circuit portion therein.

According to an embodiment, in the state in which the first connection circuit portion is bonded to the first bus bars, a conformal coating process may be performed so as to cover the first connection circuit portion and some of the first bus bars in the vicinity of the first connection circuit portion, and in the state in which the second connection circuit portion is bonded to the second bus bars, a conformal coating process may be performed so as to cover the second connection circuit portion and some of the second bus bars in the vicinity of the second connection circuit portion.

According to an embodiment, each of the first and second connection circuit portions may include: a conductive substrate layer made of a flexible material; a first insulating layer disposed on a first surface of the substrate layer and having at least one first opening formed therein so as to expose the first surface of the substrate layer; and a second insulating layer disposed on a second surface of the substrate layer and having at least one second opening formed at a position opposite the first opening with respect to the substrate layer so as to expose the second surface of the substrate layer.

According to an embodiment, the second surfaces of the first and second connection circuit portions may be disposed to be adjacent to the bus bars, and the second surfaces may be bonded to the bus bars by applying a bonding method to the first surfaces.

According to an embodiment, the second opening is formed to be larger than the first opening, and a portion of the first insulating layer may partially overlap, in a cross section of the first and second circuits, an area in which the second opening is formed.

According to an embodiment, each of the first and second connection circuit portions may include a first plating layer plated to cover at least a portion of the first surface, and a second plating layer plated to cover at least a portion of the second surface.

According to an embodiment, the thicknesses of the first and second plating layers may correspond to the thicknesses of the first and second insulating layers, respectively.

According to an embodiment, the circuit portion may further include a third insulating layer disposed on the first insulating layer and having at least one third opening formed therein at a position corresponding to the first opening.

According to an embodiment, each of the first and second connection circuit portions may further include: a third insulating layer attached to a portion of the first insulating layer and to a portion of the first plating layer adjacent to the portion of the first insulating layer; and a fourth insulating layer attached to a portion of the second insulating layer and to a portion of the second plating layer adjacent to the portion of the second insulating layer.

According to an embodiment, the third insulating layer may be attached to be in close contact with the position where the first insulating layer and the first plating layer are in contact with each other, and the fourth insulating layer may be attached to be in close contact with the position where the second insulating layer and the second plating layer are in contact with each other.

According to an embodiment, an end of the fourth insulating layer may be disposed to be in contact with ends of the bus bars.

A frame assembly manufacturing method according to another embodiment of the present disclosure may include: a step of manufacturing a frame including a first frame, a second frame disposed on the first side surface, pivotably coupled to a first end of the first frame, a plurality of first bus bars being coupled to the first frame, and a third frame pivotably coupled to a second end of the first frame, a plurality of second bus bars being coupled to the third frame; manufacturing a flexible printed circuit board including a circuit potion disposed on the first frame, a first connection circuit portion disposed on the second frame and extending from a first end of the circuit portion, and a second connection circuit portion disposed on the third frame and extending from a second end of the circuit portion; disposing a first surface of the first connection circuit portion on the plurality of first bus bars, and disposing a first surface of the second connection circuit portion on the plurality of second bus bars; and bonding the first surface of the first connection circuit portion to the plurality of first bus bars by applying a bonding method to a second surface of the first connection circuit portion, and bonding the first surface of the second connection circuit portion to the plurality of second bus bars by applying the bonding method to a second surface of the second connection circuit portion.

According to an embodiment, the frame assembly manufacturing method may further include a step of pressing the second surfaces of the first and second connection circuit portions using a jig.

According to an embodiment, the frame assembly manufacturing method may further include a step of performing a conformal coating process to cover the first and second connection circuit portion and some of the first and second bus bars in the vicinity of each of the first and second connection circuit portion.

According to an embodiment, the step of manufacturing a flexible printed circuit board may include steps of: manufacturing a substrate layer by cutting a conductive material into a predetermined shape; manufacturing a first insulating layer by cutting an insulating material into a shape having a size that covers the substrate layer; manufacturing a second insulating layer by cutting an insulating material into a shape having a size that covers the substrate layer; forming at least one first opening in the first insulating layer at a predetermined position; forming at least one second opening in the second insulating layer at a position opposite the at least one first opening with respect to the substrate layer; and disposing the first insulating layer on a first surface of the substrate layer, disposing the second insulating layer on a second surface of the substrate layer, and integrally coupling the first insulating layer, the substrate layer, and the second insulating layer.

According to an embodiment, the step of manufacturing a flexible printed circuit board may further include a step of forming a first plating layer by plating a conductive material on at least a portion of the first surface of the substrate layer exposed through the at least one first opening, and forming a plating layer by plating a conductive layer on at least a portion of the second surface of the substrate layer exposed through the at least one second opening.

According to an embodiment, the step of manufacturing a flexible printed circuit board may further include steps of: attaching a third insulating layer to a portion of the first insulating layer and a portion of the first plating layer adjacent to the portion of the first insulating layer; and attaching a fourth insulating layer to a portion of the second insulating layer and a portion of the second plating layer adjacent to the portion of the second insulating layer.

According to embodiments of the present disclosure, since the connection circuit portion of the flexible printed circuit board is directly bonded to the bus bar by any of various bonding methods (laser welding, ultrasonic bonding, resistance welding, etc.), it is possible to simplify the bonding process of the connection circuit portion and the bus bar. In addition, the types and number of parts are decreased, so that costs can be reduced, and contact stability between the connection circuit portion and the bus bar can be improved.

DETAILED DESCRIPTION

Figure 1:
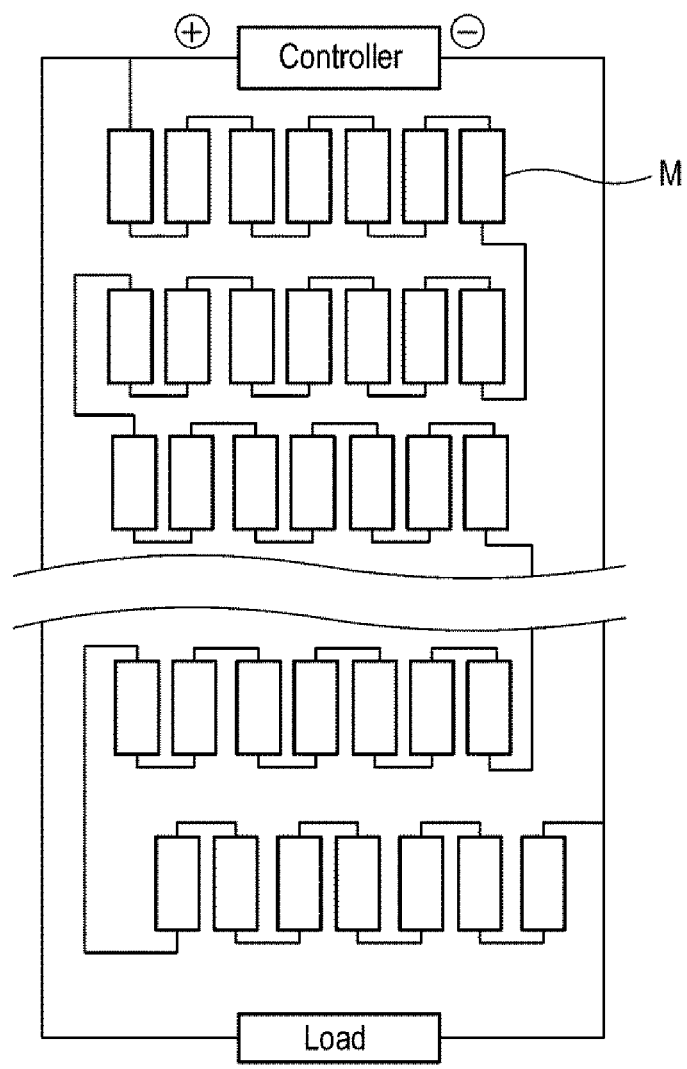
FIG. 1 is a schematic view showing the structure in which a battery module including a frame assembly is installed in a vehicle according to an embodiment of the present disclosure.

Embodiments of the present disclosure are illustrated for the purpose of explaining the technical idea of the present disclosure. The scope of rights according to the present disclosure is not limited to the embodiments presented below or to the detailed descriptions of such embodiments.

All technical and scientific terms used in the present disclosure have meanings generally understood by those of ordinary skill in the art to which the present disclosure pertains, unless otherwise defined. All terms used in the present disclosure are chosen for the purpose of more clearly describing the present disclosure and are not chosen to limit the scope of rights according to the present disclosure.

As used in the present disclosure, expressions such as "comprising", "including", "having", and the like are to be understood as open-ended terms having the possibility of encompassing other embodiments, unless otherwise mentioned in the phrase or sentence containing such expressions.

The singular form, when used in the present disclosure may include a plural meaning, unless otherwise mentioned. This applies equally to the use of the singular form in the claims.

The expressions "first", "second", and the like, when used in the present disclosure, are intended to distinguish between multiple elements, and are not intended to limit the sequence or importance of the corresponding elements.

In the present disclosure, where it is mentioned in the present disclosure that one element is "connected" or "coupled" to another element, it is to be understood that said one element may be directly connected or coupled to said another element, or may be connected or coupled to said another element via a new additional element.

Hereinafter, descriptions will be made of embodiments of the present disclosure with reference to the accompanying drawings. In the accompanying drawings, the same or corresponding elements are denoted by the same reference numerals. In the following descriptions of the embodiments, descriptions of the same or corresponding elements may be omitted. However, even if the descriptions of elements are omitted, it is not intended that such elements excluded from a certain embodiment.

Figure 2:
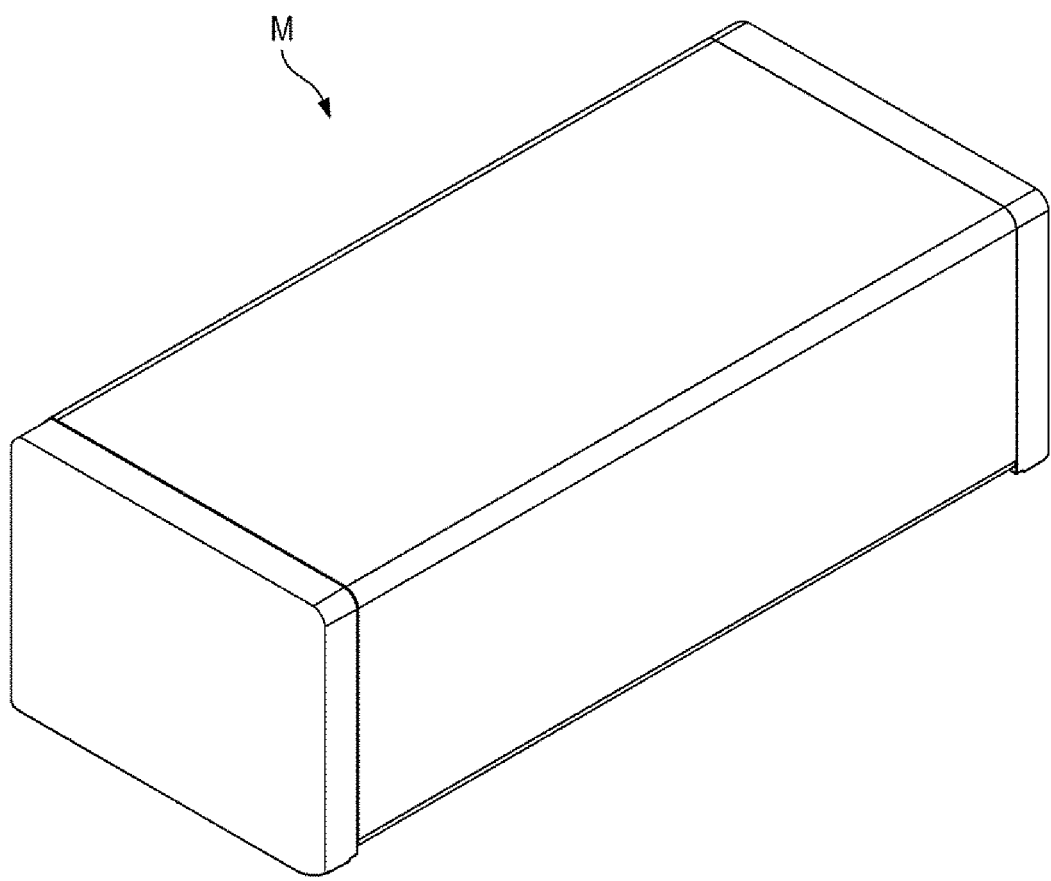
FIG. 2 is a perspective view showing an assembled battery module including a frame assembly according to an embodiment of the present disclosure.

FIG. 1 is a schematic view showing the structure in which a battery module (M) including a frame assembly is installed in a vehicle according to an embodiment of the present disclosure. FIG. 2 is a perspective view showing an assembled battery module (M) including a frame assembly according to an embodiment of the present disclosure.

A plurality of battery modules (M) may be arranged on the floor of a vehicle body. The plurality of battery modules (M) exhibiting the same output voltage may be connected in series or in parallel to each other, thereby generating a final output voltage. This final output voltage may drive a load. For example, a driving force generated in a motor, which is a kind of load, may rotate the wheels of the vehicle. The charging/discharging of each of the plurality of battery modules (M) may be controlled by a controller.

Although FIG. 1 illustrates that the battery modules (M) are connected in series to each other, the arrangement of the battery modules (M) may be varied depending on conditions such as the output voltage of each battery module (M), the layout of a vehicle, the voltage required for a load, and the like.

Figure 3:
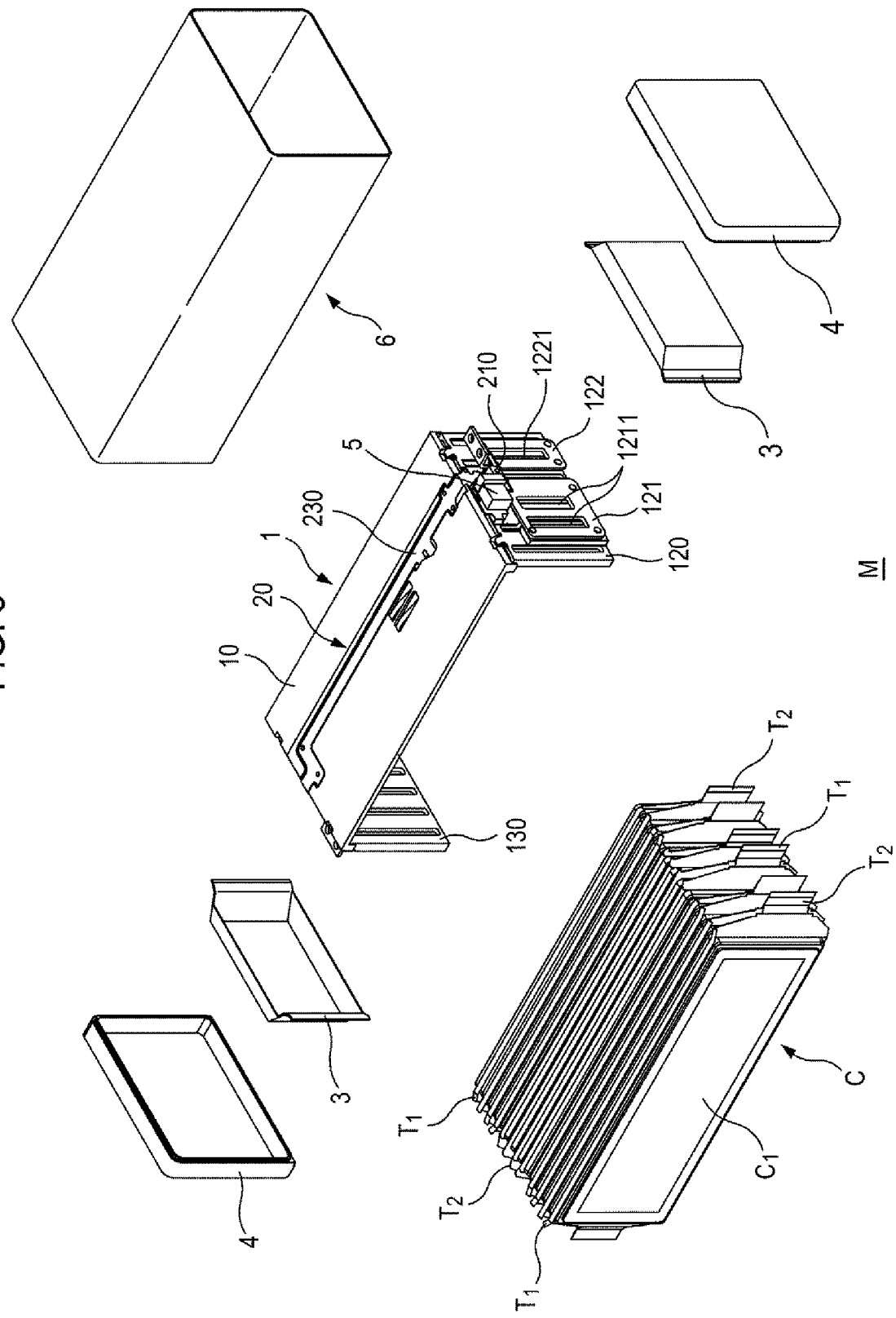
FIG. 3 is an exploded perspective view of a battery module including a frame assembly according to an embodiment of the present disclosure.
Figure 4:
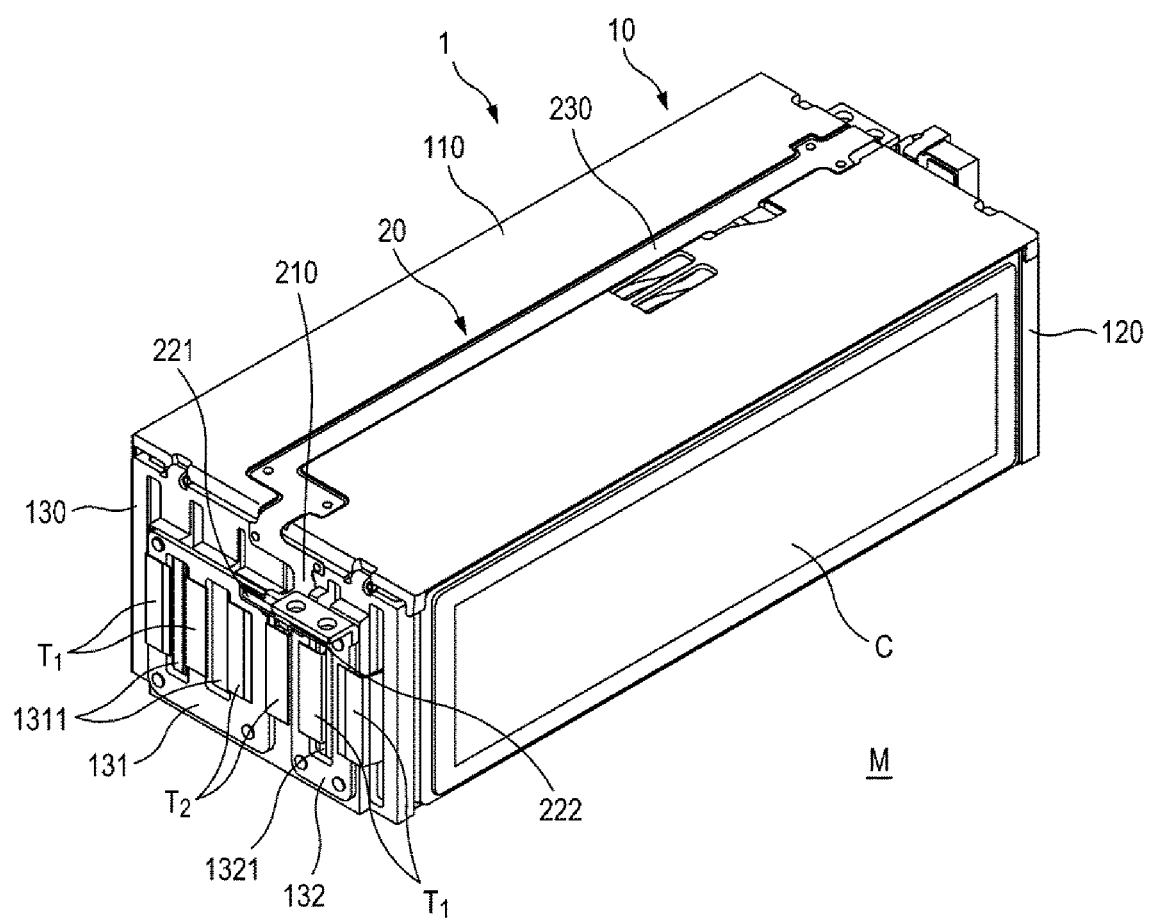
FIG. 4 is a perspective view showing the configuration in which a frame assembly and a battery cell are assembled according to an embodiment of the present disclosure.

FIG. 3 is an exploded perspective view of a battery module (M) including a frame assembly 1 according to an embodiment of the present disclosure, and FIG. 4 is a perspective view showing the configuration in which a frame assembly 1 and a battery cell (C) are coupled to each other according to an embodiment of the present disclosure.

The battery module (M) may include a plurality of stacked battery cells (C), a frame assembly 1 for fixing the battery cells, insulating covers 3 covering both sides of the frame assembly 1, module covers 4, and a housing 6. The battery cell (C) may be, for example, a secondary battery, but is not limited thereto, and any type of battery capable of being charged or discharged may be applied to the battery cell.

A terminal of the battery cell (C) may be a tap terminal that is conductive and is made of a deformable material. The battery cell (C) may include a cell body C1, a (+) tab T1 formed on one side of the cell body C1, and a (−) tab T2 formed on the opposite side of the cell body C1. The (+) tab T1 and the (−) tab T2 may be tap terminals that are conductive and flexible. The (+) and (−) tabs T1 and T2 may be made of, for example, a material including lead or aluminium, but are not limited thereto, and any kind of metal material may be applied to the tabs as long as it is flexible.

FIG. 3 shows that tap terminals of the battery cells (C) that are adjacent to each other, among the plurality of battery cells (C), are connected to each other. For example, if the tap terminals having the same polarity are connected to each other, the neighboring battery cells (C) may be electrically connected in parallel to each other. In addition, the tap terminals of the neighboring battery cells (C) may be electrically connected to each other through a surface welding process.

The module covers 4 may prevent a vehicle fire caused by collapse or breakage of the battery cells (C) in the case of a vehicle accident, and may protect the internal structure of an assembly configured by assembling the frame assembly 1 and the battery cells (C). In addition, the housing 6 may protect the assembled state of the frame assembly 1 and the plurality of battery cells (C) from an external impact. For example, the module covers 4 and the housing 6 may be made of a metal material having high strength.

The frame assembly 1 may include a frame 10, a plurality of bus bars 121, 122, 131, and 132, a flexible printed circuit board (FPCB) 20, and a connector 5. The flexible printed circuit board 20 may be arranged in the longitudinal direction of the frame 10. The connector 5 may be configured to transmit and receive signals indicating the state of the plurality of battery cells (C), such as signals related to voltage sensing and temperature sensing, to and from the controller shown in FIG. 1, and may be coupled to the flexible printed circuit board 20.

In an embodiment, the frame 10 may include a first frame 110 disposed on the upper surface of the frame 10, a second frame 120 disposed on a first lateral surface of the frame 10 and pivotably coupled to one end of the first frame 110, and a third frame 130 disposed on a second lateral surface of the frame 10 and pivotably coupled to the opposite end of the first frame 110. In addition, the frame 10 may be configured to surround an upper surface and both lateral surfaces of the plurality of battery cells (C). The frame 10 may be made of a non-conductive synthetic resin material.

The plurality of bus bars 121, 122, 131, and 132 may be made of a conductive metal material, and may include a plurality of first bus bars 121 and 122 and a plurality of second bus bars 131 and 132. A plurality of first bus bars 121 and 122 may be disposed in the second frame 120, and a plurality of second bus bars 131 and 132 may be disposed in the third frame 130. The plurality of first bus bars 121 and 122 and the plurality of second bus bars 131 and 132 may be configured to be connected to the terminals of the plurality of battery cells (C).

In an embodiment, a plurality of battery cells C are connected in parallel to N (N being an integer equal to or larger than 2) battery cells adjacent thereto by connecting same-pole terminals to each other, thereby forming a plurality of battery cell groups having one terminal pair. In addition, the plurality of battery cell groups may be configured to be connected in series and/or in parallel as the terminals of the plurality of battery cell groups are connected to a plurality of bus bars 122, 124, 132, and 134. According to this structure, the plurality of battery cell groups may be connected in series and/or in parallel to form the output voltage of a battery module M.

For example, when twelve battery cells are stacked, it is possible to configure six battery cell groups in which two battery cells are connected in parallel (two same-pole terminals of battery cells are directly connected) as illustrated in FIG. 3. In addition, three battery cell groups may be configured by connecting four battery cells in parallel. The terminals of the plurality of battery cell groups may be connected in series by being bonded to a bus bar.

The (+) and (−) tabs T1 and T2 of the battery cells (C) may remain straight before the battery cells (C) are coupled to the frame assembly 1. The straight tabs T1 and T2 may pass through slits 1211 and 1221 formed in the first bus bars 121 and 122 and the slits 1311 and 1321 formed in the second bus bars 131 and 132.

The battery cells (C) and the frame assembly 1 may be coupled through the following processes. The second and third frames 120 and 130 of the frame assembly 1 may cover the upper surface of the battery cell (C) while being pivoted outwards. Then, the pivoted second and third frames 120 and 130 are pivoted inwards such that the tabs T1 and T2 of the battery cells (C) pass through the slits 1211 and 1221 formed in the first bus bars 121 and 122 and the slits 1311 and 1321 formed in the second bus bars 131 and 132. Next, the tabs T1 and T2 are bent such that surfaces of the tabs come into contact with the front surfaces of the first bus bars 121 and 122 and the second bus bars 131 and 132. Thereafter, the tabs T1 and T2 are bonded to the first bus bars 121 and 122 and the second bus bars 131 and 132 so as to be electrically connected to each other by applying a welding process to the opposite surfaces of the tabs T1 and T2.

Figure 5:
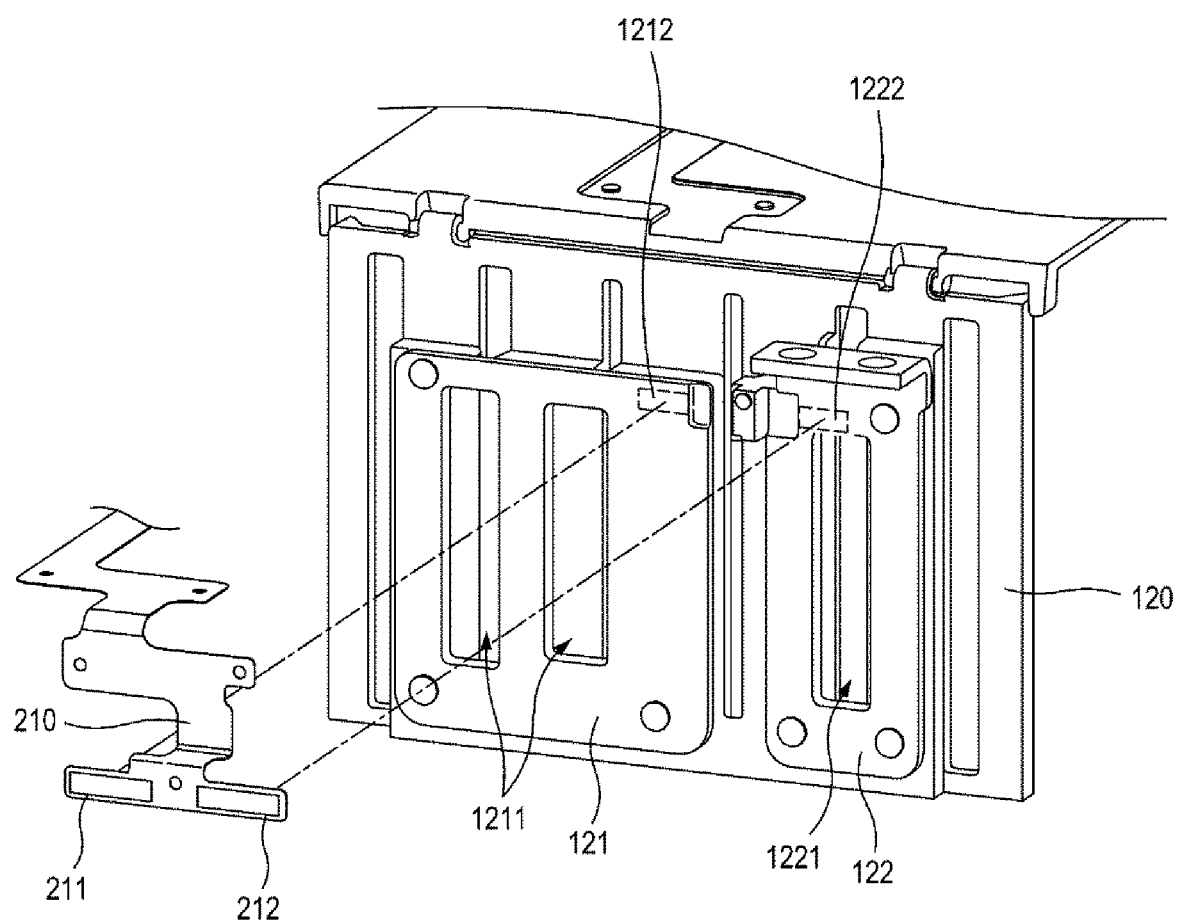
FIG. 5 is an exploded perspective view showing the configuration in which a connection circuit portion of a flexible printed circuit board and a bus bar are disassembled according to a first embodiment.

The above method can reduce the number of welding processes between the tap terminals by more than half, compared with the method in which the battery cells (C) are connected in a line, because the bus bars 121, 122, 131, and 132 are used. In addition, since the battery cell groups are connected in series to each other by the bus bars, it is possible to configure the battery capacity and the output voltage depending on the vehicle type without restriction using the bus bars. Referring to FIGS. 4 and 5, since the bus bars 121 and 122 are directly and electrically connected to the flexible printed circuit board 20, it is possible to sense overvoltage and temperature of the battery cells (C) through the flexible printed circuit board 20.

Referring to FIG. 3, the insulating covers 3 may be interposed between the plurality of bus bars 121, 122, 131, and 132 and the module covers 4, and may be provided on both sides of the frame assembly 1. In addition, the insulating covers 3 may be made of a non-conductive synthetic resin material. Thus, it is possible to prevent a short circuit between the bus bars 122, 124, 132, and 134 and the module covers 4, which are coupled to the frame assembly 1.

Figure 6:
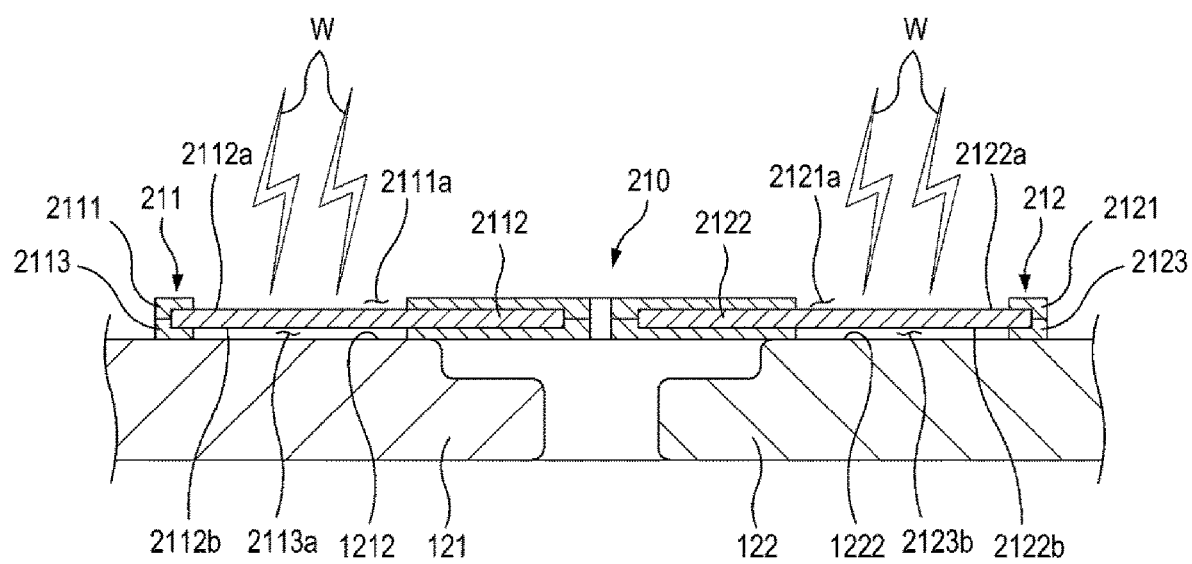
FIG. 6 is a cross-sectional view showing the configuration in which the connection circuit portion and the bus bar are cut in the thickness direction in a state where the connection circuit portion and the bus bar shown in FIG. 5 are bonded to each other.

FIG. 5 is an exploded perspective view showing the configuration in which a connection circuit portion of a flexible printed circuit board 20 and a bus bar are disassembled according to a first embodiment. FIG. 6 is a cross-sectional view showing the configuration in which the connection circuit portion and the bus bar are cut in the thickness direction in a state where the connection circuit portion and the bus bar shown in FIG. 5 are bonded to each other. Descriptions the same as those of the above-described embodiments will be omitted.

Referring to FIG. 5, a plurality of first bus bars 121 and 122 may include a first-a bus bar 121 and a first-b bus bar 122. The first-a bus bar 121 may have two slits 1211 formed therein. In addition, the first-b bus bar 122 may have a single slit 1221 formed therein. The tap terminals of the battery cells (C) may pass through the slits 1211 and 1221.

The first connection circuit portion 210 may include a first-a bonding portion 211 extending in one direction and a first-b bonding portion 212 extending in the opposite direction. The first-a bonding portion 211 may be bonded to the first-a bus bar 121, and the first-b bonding portion 212 may be bonded to the first-b bus bar 122. Referring to FIG. 6, the first-a and first-b bonding portions 211 and 212 may include conductive substrate layers 2112 and 2122 made of a flexible material, first insulating layers 2111 and 2121 provided on one surfaces of the substrate layers 2112 and 2122 and having one or more first openings 2111*a* and 2121*a* formed therein such that first surfaces 2112*a* and 2122*a* of the substrate layers 2112 and 2122 are exposed therethrough, and second insulating layers 2113 and 2123 provided on the opposite surfaces of the substrate layers 2112 and 2122 and having one or more second openings 2113*a* and 2123*b* formed therein such that second surfaces 2112*b* and 2122*b* of the substrate layers 2112 and 2122 are exposed therethrough, respectively.

The first connection circuit portion 210 may be bonded to the first bus bars 121 and 122 through the following processes. First, the second surfaces 2112b and 2122b of the first-a and first-b bonding portions 211 and 212 are arranged so as to come into contact with the welding surfaces 1212 and 1222 disposed at the corners of the upper surfaces of the first-a and first-b bus bars 121 and 122, respectively. Next, the first surfaces 2112a and 2122a of the first-a and first-b bonding portions 211 and 212 may be fused by applying a welding process (laser welding, ultrasonic welding, resistance welding, etc.) so that the second surfaces 2112b and 2122b and the welding surfaces 1212 and 1222 may be directly bonded so as to be electrically connected. In an embodiment, the welding surfaces 1212 and 1222 may protrude from the first-a and first-b bus bars 121 and 122, may be recessed therefrom, or may be formed to be even with the portions adjacent to the welding surfaces 1212 and 1222 of the first-a and first-b bus bars 121 and 122.

According to the above-described method, the first-a and first-b bonding portions 211 and 212 and the first-a and first-b bus bars 121 and 122 are directly and electrically connected to each other using at least one of the above-described welding processes, thereby improving the electrical conductivity between the connection circuit portion and the bus bar and enhancing the stability of fixation. In addition, since there is no coupling means, such as a clamp, between the first connection circuit portion 210 and the bus bars 121 and 122, the stability against electrical contact may be improved, and the number of parts may be reduced, thereby reducing costs and processes. Further, since both surfaces of the substrate layers 2112 and 2122 are exposed, it is possible to secure a structure in which the connection circuit portion can be directly coupled to the bus bar, and to reduce the number of applied parts, work processes, weights, and costs.

Referring to FIGS. 5 and 6, although the welding process between the first connection circuit portion 210 and the first bus bars 121 and 122 has been described, the same welding process may be applied to the welding between the second connection circuit portion 220 and the second bus bars 131 and 132. Thus, an identical description related thereto will be omitted.

Figure 7:
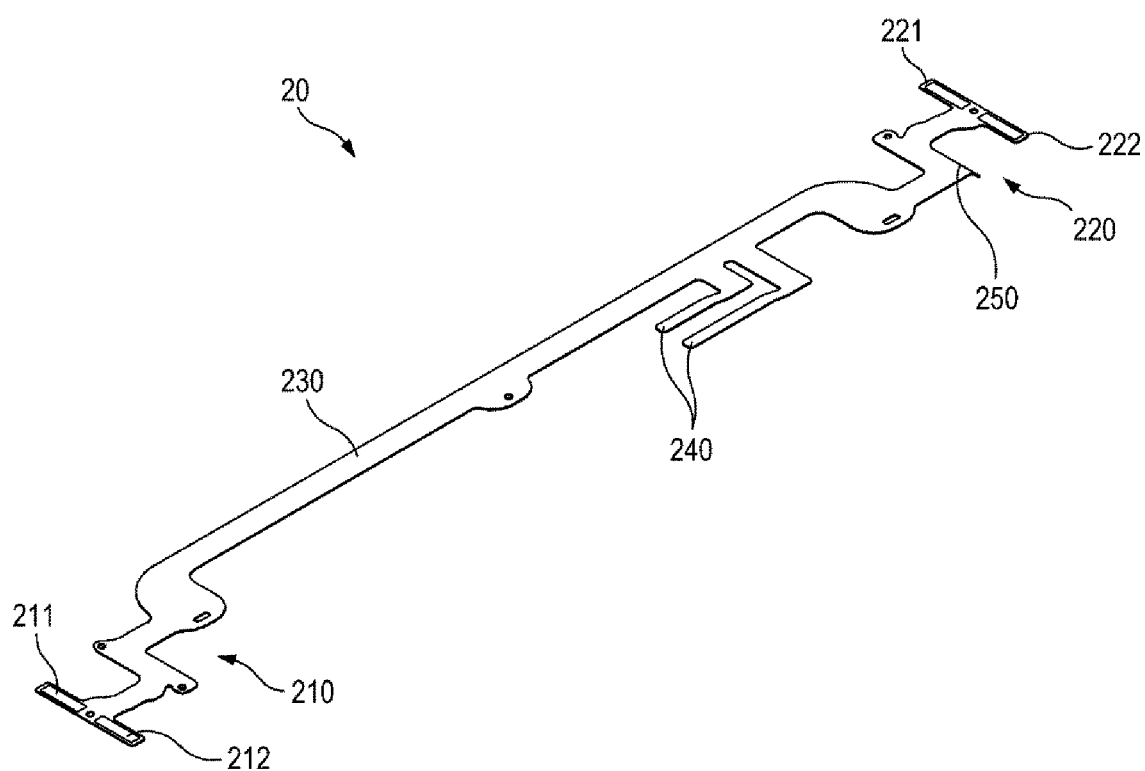
FIG. 7 is a perspective view showing the overall configuration of a flexible printed circuit board according to an embodiment of the present disclosure.

FIG. 7 is a perspective view showing the overall configuration of a flexible printed circuit board 20 according to an embodiment of the present disclosure.

Referring to FIGS. 3 and 4, the flexible printed circuit board 20 may be arranged so as to come into contact with the first to third frames 110, 120, and 130. The flexible printed circuit board 20 may include a substrate layer of a conductive metal material and an insulating layer of a non-conductive synthetic resin material. The flexible printed circuit board 20 may be configured such that a conductive substrate layer is surrounded by a non-conductive insulating layer, and may be formed to be somewhat thin (for example, 2 mm or less) in order to be flexible.

Referring to FIGS. 3 and 4, the flexible printed circuit board 20 may be arranged along the upper surface and both lateral surfaces of the frame 10. In an embodiment, the flexible printed circuit board 20 may include a circuit portion 230 arranged in the first frame 110, a first connection circuit portion 210 extending from one end of the circuit portion 230 and connected to the plurality of first bus bars 121 and 122, and a second connection circuit portion 220 extending from the opposite end of the circuit portion 230 and connected to the plurality of second bus bars 131 and 132. In addition, the first connection circuit portion 210 may include a first-a bonding portion 211 extending in one direction and a first-b bonding portion 212 extending in the opposite direction. Further, the second connection circuit portion 220 may include a second-a bonding portion 221 extending in one direction and a second-b bonding portion 222 extending in the opposite direction.

In an embodiment, the flexible printed circuit board 20 may include a temperature sensor portion 240 extending from the circuit portion 230 and having a temperature sensor fixed thereto. In addition, the flexible printed circuit board 20 may include a terminal portion 250 extending from the circuit portion 230, which is adjacent to the second connection circuit portion 220. The connector 5 shown in FIG. 3 may be directly coupled to the terminal portion 250.

Figure 8:
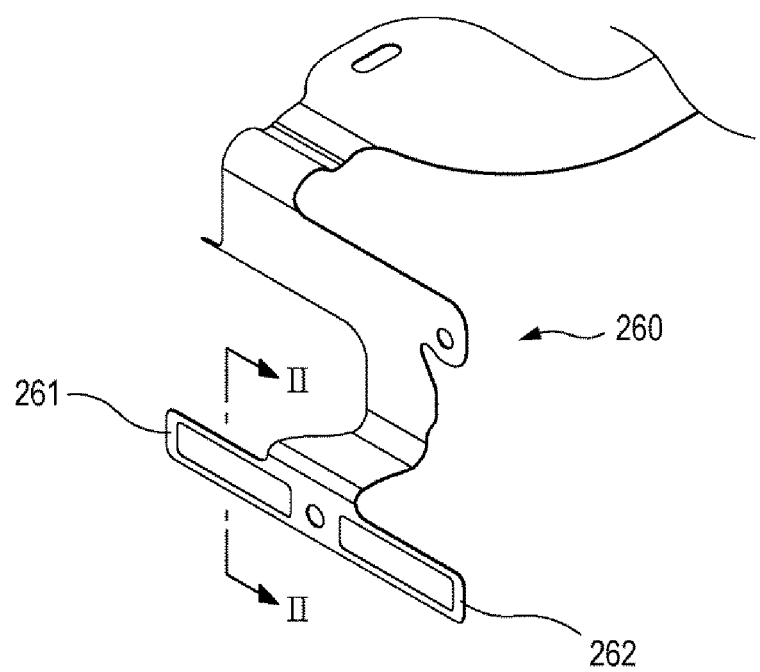
FIG. 8 is a perspective view showing a connection circuit portion of a flexible printed circuit board according to a second embodiment.
Figure 9:
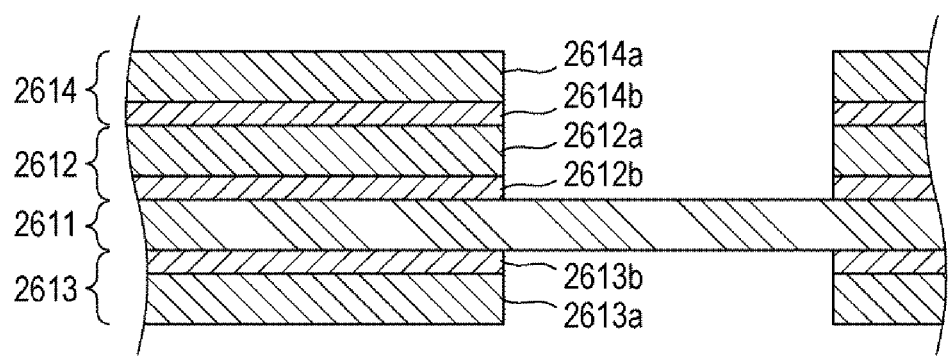
FIG. 9 is a cross-sectional view of the connection circuit portion taken along the line II-II in FIG. 8.

FIG. 8 is a perspective view showing a connection circuit portion 260 of a flexible printed circuit board according to a second embodiment, and FIG. 9 is a cross-sectional view of the connection circuit portion 260 taken along the line II-II in FIG. 8. Descriptions the same as those of the above-described embodiments will thus be omitted.

The connection circuit portion 260 may include a first bonding portion 261 extending in one direction such that both sides thereof are exposed and a second bonding portion 262 extending in the opposite direction such that both sides thereof are exposed. The connection circuit portion 260 may include a substrate layer 2611 made of a conductive material and insulating layers 2612, 2613, and 2614 made of a non-conductive material so as to surround the substrate layer 2611. In addition, the conductive material may include copper, and the non-conductive material may include a PEN or PI material.

In an embodiment, the insulating layers 2612, 2613, and 2614 may include a first insulating layer 2612 attached to one surface of the substrate layer 2611, a second insulating layer 2613 attached to the opposite surface of the substrate layer 2611, and a third insulating layer 2614 attached onto the first insulating layer 2612. Each of the first to third insulating layers 2612, 2613, and 2614 may include non-conductive layers 2612a, 2613a, and 2614a and bonding layers 2612b, 2613b, and 2614b for bonding the same.

In another embodiment, the number or arrangement of stacked layers may be varied depending on the work processes of the frame assembly or the tensile strength required for the connection circuit portion 260. For example, two insulating layers may be additionally provided on the opposite surface of the substrate layer 2611.

According to an embodiment, since the first and third insulating layers 2612 and 2614 are provided on one surface of the substrate layer 2611 and the second insulating layer 2613 is provided on the opposite surface of the substrate layer 2611, it is possible to reduce the possibility of breakage of the connection circuit portion 260 due to tension, compared to the configuration in which a single insulating layer is provided on each surface of the substrate layer 2611. In addition, if an external force is applied to the connection circuit portion 260 in the process of transferring or assembling the frame assembly, a part of the connection circuit portion 260 having a single insulating layer is likely to break. Therefore, it is possible to enhance the tensile force of the connection circuit portion 260 by providing two insulating layers to one surface of the connection circuit portion 260. In addition, since the cover layer having a double structure covers the substrate layer in the flexible printed circuit board, reliability of the tensile force of the circuit portion can be secured, and breakage thereof can be prevented.

A method of providing two insulating layers to one surface of a substrate layer as described in the above embodiment may be applied to a connection circuit portion 260 that is susceptible to breakage. In addition, the method may be applied to the entire flexible printed circuit board 20, as well as the connection circuit portion 260, depending on the characteristics of the vehicle and the cost of manufacturing the vehicle. The openings formed in the insulating layers 2612, 2613, and 2614 may be formed so as to expose both surfaces of the substrate layer 2611 as shown in FIG. 9. Therefore, it is possible to secure a structure in which the circuit portion may be directly bonded to the bus bar, and it is possible to reduce the number of applied parts, work processes, weight, and cost.

Figure 10:
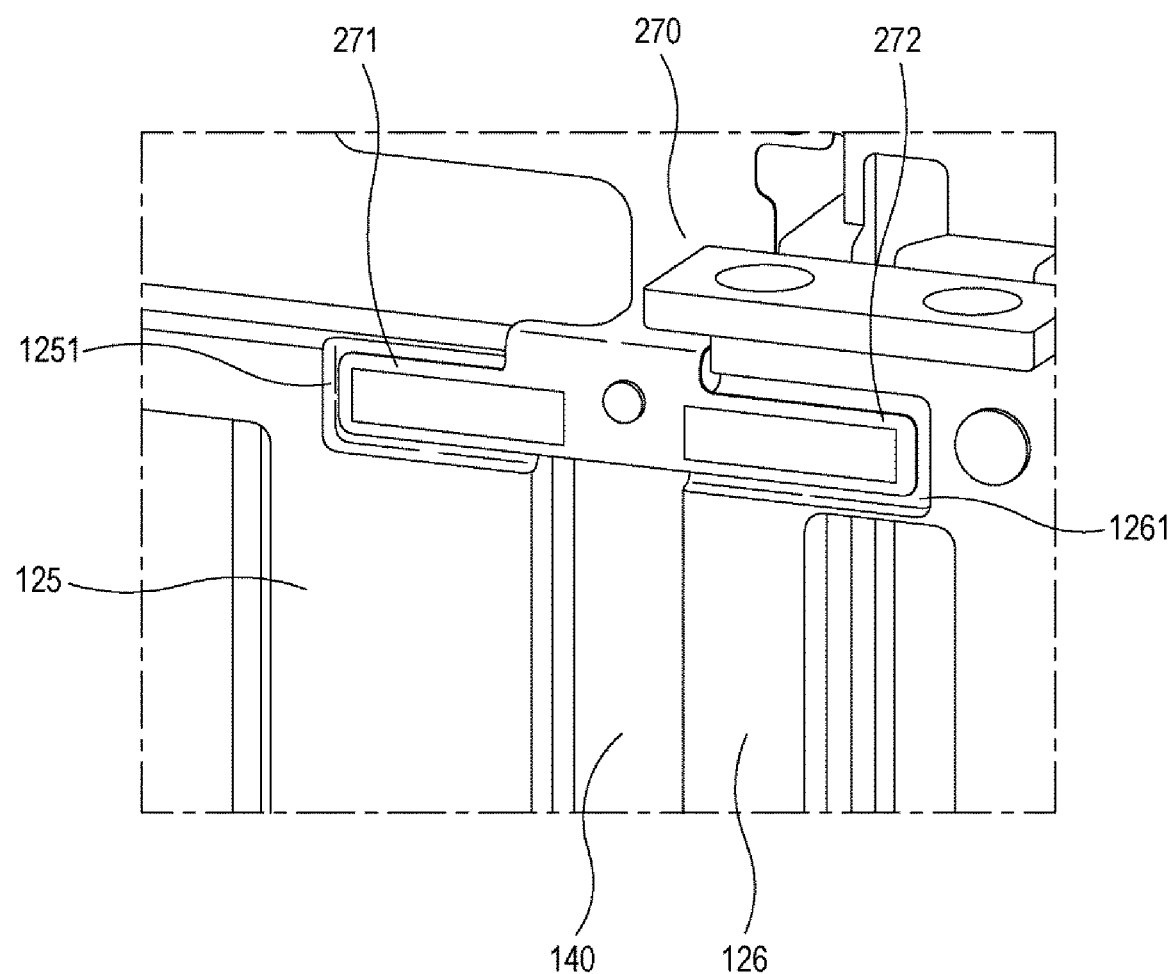
FIG. 10 is a perspective view showing the configuration in which a connection circuit portion and a bus bar are bonded to each other according to a third embodiment.
Figure 11:
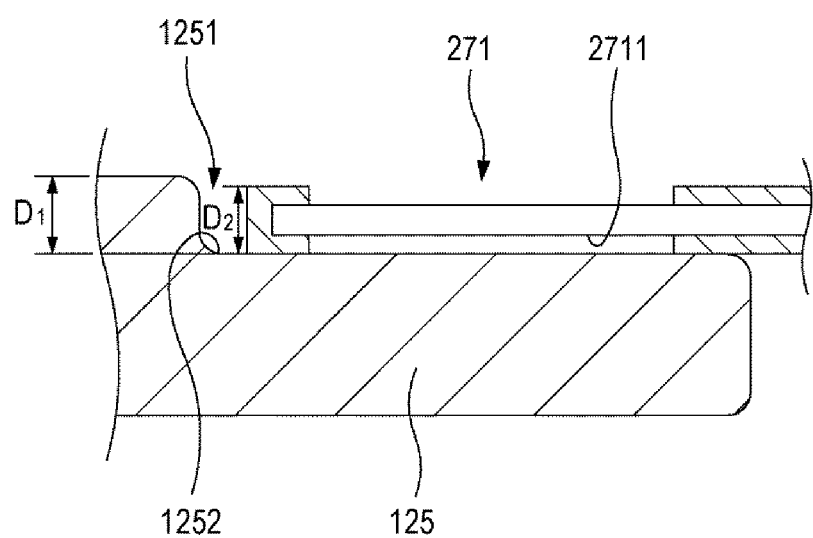
FIG. 11 is a cross-sectional view showing the configuration in which a connection circuit portion and a bus bar are bonded to each other according to a third embodiment.

FIG. 10 is a perspective view showing the configuration in which a connection circuit portion 270 and a bus bar 125 are bonded to each other according to a third embodiment, and FIG. 11 is a cross-sectional view showing the configuration in which a connection circuit portion 270 and a bus bar 125 are bonded to each other according to a third embodiment. Descriptions the same as those of the above embodiments will be omitted.

The connection circuit portion 270 may include a first bonding portion 271 extending in one direction such that both surfaces thereof are exposed and a second bonding portion 272 extending in the direction opposite the one direction such that both surfaces thereof are exposed. In an embodiment, the bus bars 125 and 126 may have recesses 1251 and 1261 configured to receive the first and second bonding portions 271 and 272, respectively. The recesses 1251 and 1261 may be shaped so as to be bent toward the side frame 140, and may have sizes corresponding to the first and second bonding portions 271 and 272.

In an embodiment, the depth D1 of the recesses 1251 and 1261 may be configured to be greater than the thickness D2 of the first and second bonding portions 271 and 272. The lower surface 2711 of the first bonding portion 271 may be bonded to the upper surface 1252 of the recess 1251, and the lower surface of the second bonding portion 272 may also be bonded to the upper surface of the recess 1261. Thus, in the state in which the first and second bonding portions 271 and 272 are bonded to the recesses 1251 and 1261, it is possible to reduce damage to the first and second bonding portions 271 and 272, which is caused in the process of transferring or assembling the frame assembly.

According to the above-described embodiment, a positioning structure capable of receiving a circuit portion is provided in a bus bar. Thus, since the operator may easily identify the welding position with the naked eye, it is possible to improve workability. In addition, the circuit portion can be placed at the correct position, thereby enhancing quality.

Figure 12:
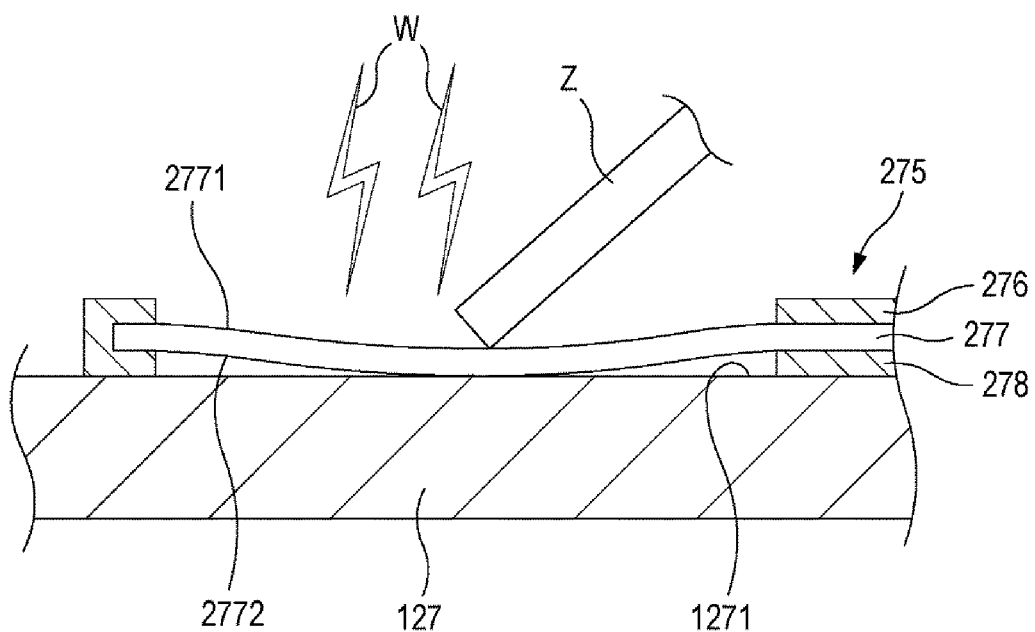
FIG. 12 is a cross-sectional view showing a process of welding a connection circuit portion to a bus bar using a jig according to a fourth embodiment.

FIG. 12 is a cross-sectional view showing a process of welding a connection circuit portion 275 to a bus bar 127 using a jig according to a fourth embodiment. Descriptions the same as those of the above-described embodiments will be omitted.

The connection circuit portion 275 may include a substrate layer 277, a first insulating layer 276 attached to the upper surface 2771 of the substrate layer 277, and a second insulating layer 278 attached to the lower surface 2772 of the substrate layer 277. A gap (G) (i.e., an air gap) having a size corresponding to the thickness of the second insulating layer 278 may be formed between the lower surface 2772 of the substrate layer 277 and the upper surface 1271 of the bus bar 127 in the state in which the connection circuit portion 275 is placed on the bus bar 127. Therefore, if a welding process, such as welding (W), is performed on the upper surface 2771 of the substrate layer 277 in the presence of the gap (G), a required level of welding quality may not be obtained. In addition, if there is a portion of the lower surface 2772 of the substrate layer 277 that is not in contact with the upper surface 1271 of the bus bar 127, the portion of the substrate layer 277 to which the welding process (W) is applied may be blackened, or the insulating layer may be burnt.

In an embodiment, the connection circuit portion 270 is arranged to come into contact with the bus bar 127, and then the upper surface 2771 of the substrate layer 277 may be pressed using a jig (Z). In this state, since the gap (G) between the substrate layer 277 and the bus bar 127 is eliminated, the contact area between the lower surface 2772 of the substrate layer 277 and the upper surface 1271 of the bus bar 127 may be increased. In addition, if the welding process (W) is applied to the upper surface 2771 of the substrate layer 277 while the substrate layer 277 is pressed by the jig (Z), the welding performance and the workability may be improved.

Figure 13:
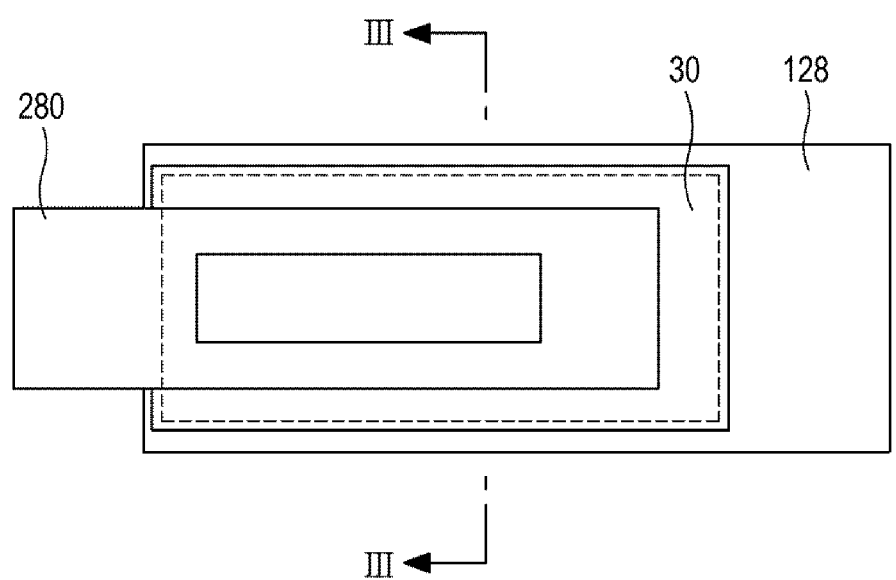
FIG. 13 is a top view showing the configuration in which a connection circuit portion and a bus bar are processed with conformal coating in the state in which the connection circuit portion and the bus bar are bonded to each other according to a fourth embodiment.
Figure 14:
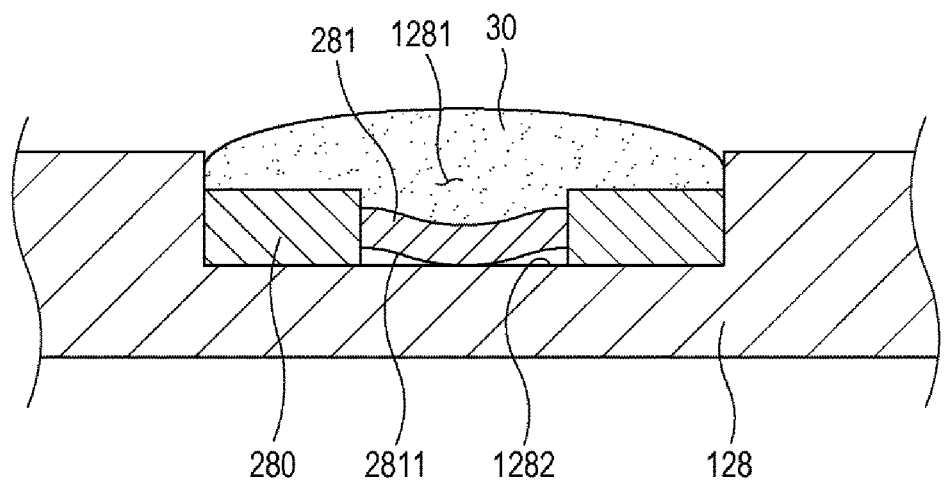
FIG. 14 is a cross-sectional view showing the configuration processed with conformal coating, taken along the line III-III in FIG. 13.

FIG. 13 is a top view showing the configuration in which a connection circuit portion 280 and a bus bar 128 are processed with conformal coating in the state in which they are bonded to each other according to a fourth embodiment, and FIG. 14 is a cross-sectional view showing the configuration processed with conformal coating, taken along the line III-III in FIG. 13.

In an embodiment, in the state in which the connection circuit portion 280 is bonded to the bus bar 128, a conformal coating process may be performed so as to cover the connection circuit portion 280 and the surrounding area of the connection circuit portion 280 (i.e., a portion of the bus bar 128 in the area surrounding the connection circuit portion 280). A conformal coating layer 30 may be formed of a non-conductive material, and may include, for example, materials such as acrylic, urethane, and the like. In addition, the conformal coating layer 30 may be coated only in a required area using a nozzle (not shown).

Referring to FIG. 14, first, the connection circuit portion 280 is placed in a recess 1281 formed in the bus bar 128. Next, the lower surface 2811 of a substrate layer 281 of the connection circuit portion 280 and the upper surface 1282 of the bus bar 128 are bonded to each other. Thereafter, a conformal coating process is conducted on the connection circuit portion 280, thereby forming a conformal coating layer 30. As described above, if the conformal coating layer 30 is formed on the connection circuit portion 280, it is possible to prevent corrosion of the substrate layer 281 and to protect the connection circuit portion 280 and the bus bar 128. In addition, the welding strength between the connection circuit portion 280 and the bus bar 128 can be improved.

Figure 15:
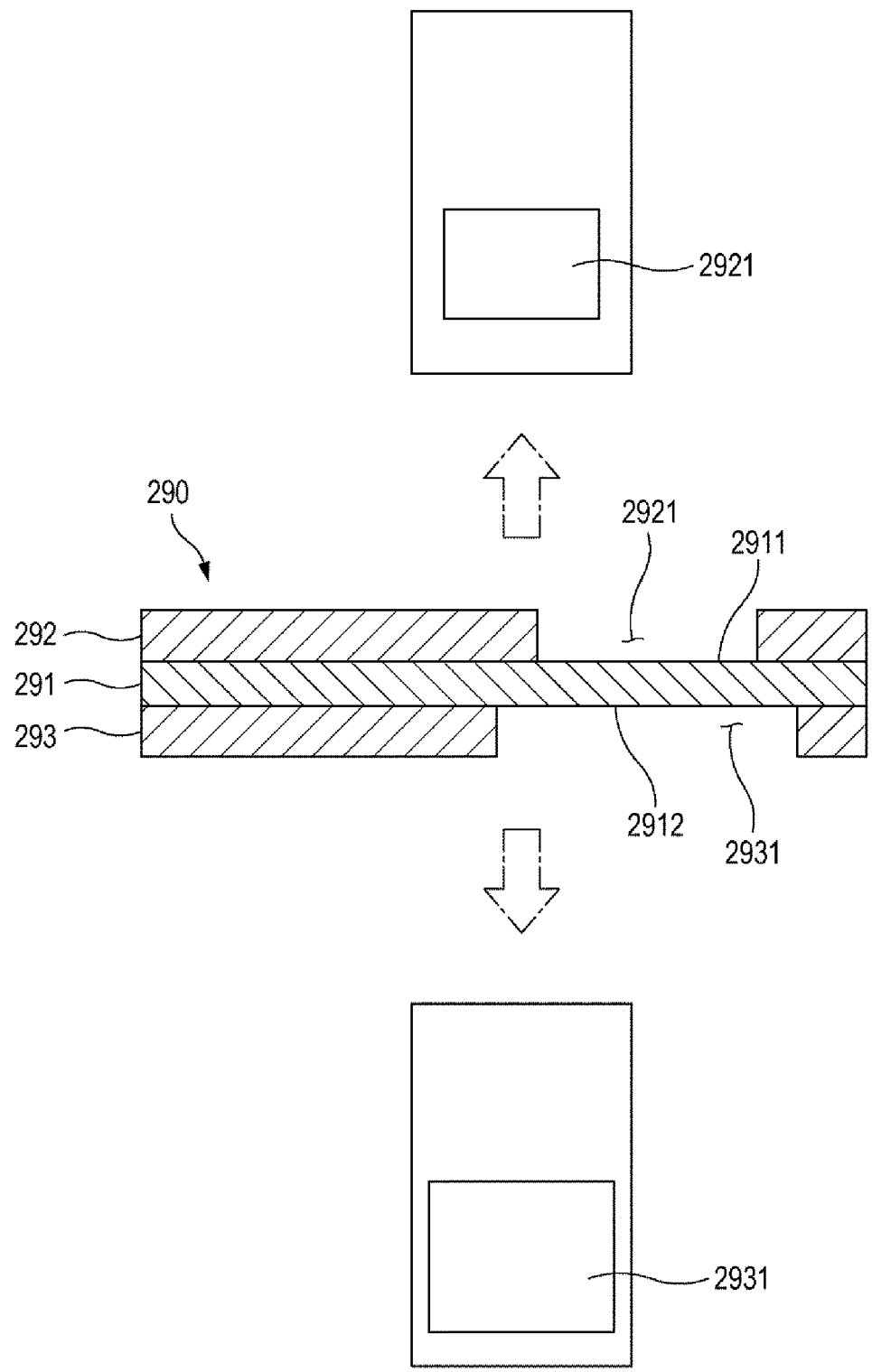
FIG. 15 is a cross-sectional view showing the configuration in which openings formed in a first insulating layer and a second insulating layer of a connection circuit portion have different sizes from each other according to a fifth embodiment.

FIG. 15 is a cross-sectional view showing the configuration in which openings formed in first and second insulating layers 292 and 293 of a connection circuit portion 290 have different sizes from each other according to a fifth embodiment.

In an embodiment, the connection circuit portion 290 may include a conductive substrate layer 291 formed of a flexible material, a first insulating layer 292 provided on one surface of the substrate layer 291 and having at least one first opening 2921 formed therein so as to expose a first surface 2911 of the substrate layer 291, and a second insulating layer 293 provided on the opposite surface of the substrate layer 291 and having at least one second opening 2941 formed in the side opposite the first opening 2921 with respect to the substrate layer 291 so as to expose a second surface 2912 of the substrate layer 291. The first insulating layer 292 may be arranged to face the bus bar, and the second insulating layer 293 may be arranged toward the outside of the bus bar.

The second opening 2931 may be formed to be larger than the first opening 2921. In addition, the area of the first surface 2911 may be smaller than the area of the second surface 2912. Thus, a portion of the first insulating layer 292 may partially overlap the area of the second opening 2931 in the cross section of the connection circuit portion 290. The substrate layer 291 may be bent toward the bus bar when welding the connection circuit portion 290 to the bus bar, which may cause detachment between the substrate layer 291 and the first insulating layer 292. In addition, the boundary of the first surface 2911 of the substrate layer 291 in the connection circuit portion 290 may be more likely to be damaged. Therefore, by reducing the area of the first surface 2911 that is exposed by the first insulating layer 292, it is possible to increase the rigidity of the connection circuit portion 290, thereby preventing breakage of the connection circuit portion 290.

Figure 16:
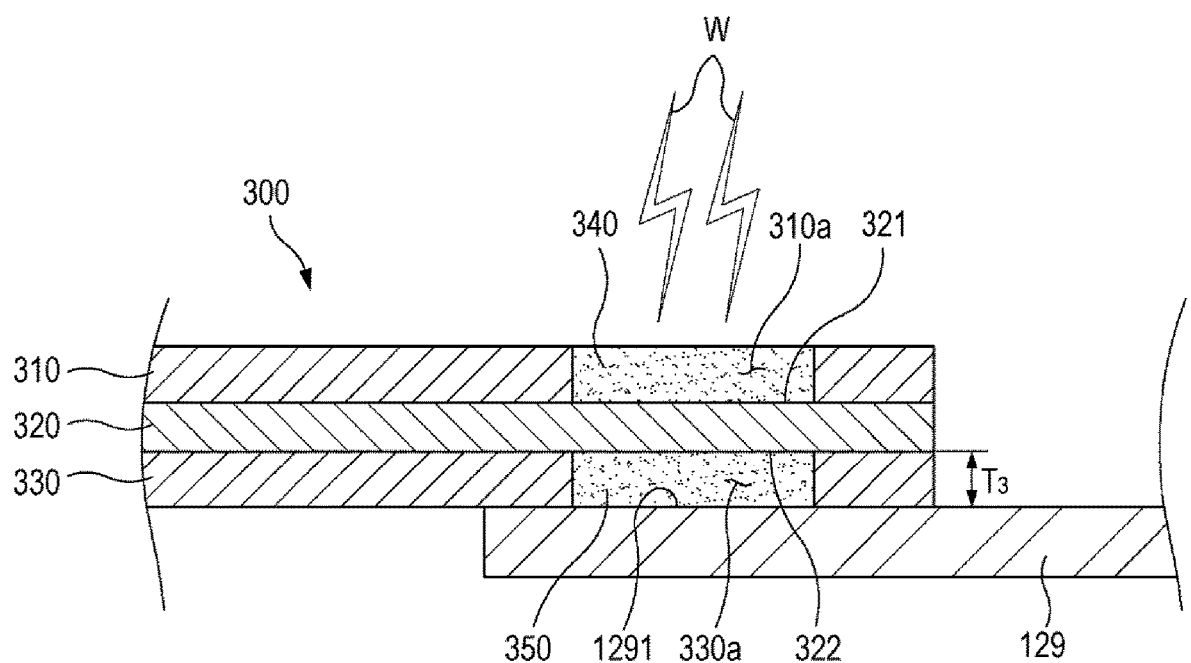
FIG. 16 is a cross-sectional view showing the configuration in which plating layers are formed on a substrate layer of a connection circuit portion according to a sixth embodiment.

FIG. 16 is a cross-sectional view showing the configuration in which plating layers 340 and 350 are formed on a substrate layer 320 of a connection circuit portion 300 according to a sixth embodiment.

The connection circuit portion 300 may include a substrate layer 320, a first insulating layer 310, and a second insulating layer 330 provided to face the bus bar 129. The first insulating layer 310 may have a first opening 310a formed therein so as to expose a first surface 321 of the substrate layer 320. The second insulating layer 330 may have a second opening 330a formed therein so as to expose a second surface 322 of the substrate layer 320. In an embodiment, a second plating layer 350 may be plated in the second opening 330a so as to cover at least a portion of the second surface 322. In addition, a first plating layer 340 may be plated in the first opening 310a so as to cover at least a portion of the first surface 321. The first and second plating layers 340 and 350 may be formed of a conductive material, and may be formed of, for example, the same material as the substrate layer 320.

In the state in which the connection circuit portion 300 is in contact with the bus bar 129, the second plating layer 350 may fill in the air gap between the substrate layer 320 and the bus bar 129. In addition, the second plating layer 350 may have a thickness corresponding to the thickness T3 of the second insulating layer 330. Therefore, in the case of applying a welding process (W) to the first plating layer 340 or the first surface 321, the second plating layer 350 may be bonded to the upper surface 1291 of the bus bar 129 without performing a process of bending the substrate layer 320 using a jig.

Figure 17:
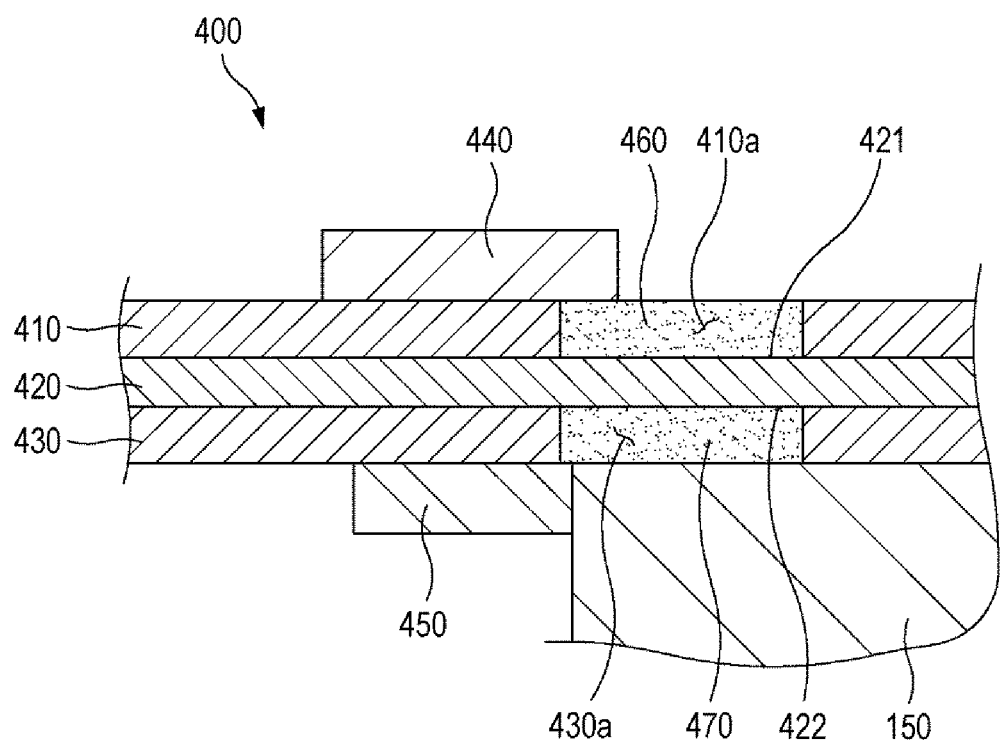
FIG. 17 is a cross-sectional view showing the configuration in which third and fourth insulating layers are stacked on first and second insulating layers of a connection circuit portion, respectively, according to a seventh embodiment.

FIG. 17 is a cross-sectional view showing the configuration in which third and fourth insulating layers 440 and 450 are stacked on first and second insulating layers 410 and 430 of a connection circuit portion 400, respectively, according to a seventh embodiment.

The connection circuit portion 400 may include a substrate layer 420, a first insulating layer 410 provided on one surface of the substrate layer 420 and having at least one first opening 410a formed therein so as to expose a first surface 421 of the substrate layer 420, and a second insulating layer 430 provided on the opposite surface of the substrate layer 420 and having at least one second opening 430a formed therein so as to expose a second surface 422 of the substrate layer 420. In addition, first and second plating layers 460 and 470 may be plated on at least a portion of the first surface 421 and the second surface 422, which are exposed through the first and second openings 410a and 430a.

In an embodiment, the connection circuit portion 400 may further include a third insulating layer 440 attached to a portion of the first insulating layer 410 and a portion of the first plating layer 460 adjacent to the portion of the first insulating layer 410, and a fourth insulating layer 450 attached to a portion of the second insulating layer 430 and a portion of the second plating layer 470 adjacent to the portion of the second insulating layer 430.

The third insulating layer 440 may be closely attached to the area where the first insulating layer 410 and the first plating layer 460 are in contact with each other, and the fourth insulating layer 450 may be closely attached to the area where the second insulating layer 430 and the second plating layer 470 are in contact with each other. That is, portions of the third and fourth insulating layers 440 and 450 may be configured to cover the edges of the first and second plating layers 460 and 470. Thus, portions of the third and fourth insulating layers 440 and 450 may partially overlap the area in which the first and second plating layers 460 and 470 are formed in the cross section of the connection circuit portion 400.

The end of the fourth insulating layer 450 may be disposed in contact with the end of the bus bar 150. In the process of welding the second plating layer 470 to the bus bar 150, cracks may occur between the first plating layer 460 and the first insulating layer 410 and between the second plating layer 470 and the second insulating layer 430. However, since the third and fourth insulating layers 440 and 450 cover portions of the first and second plating layers 460 and 470, it is possible to prevent the occurrence of cracks described above. In addition, the third and fourth insulating layers 440 and 450 may serve as reinforcing members for improving the bending strength of the connection circuit portion 400, and may prevent disconnection of the substrate layer 420.

Figure 18:
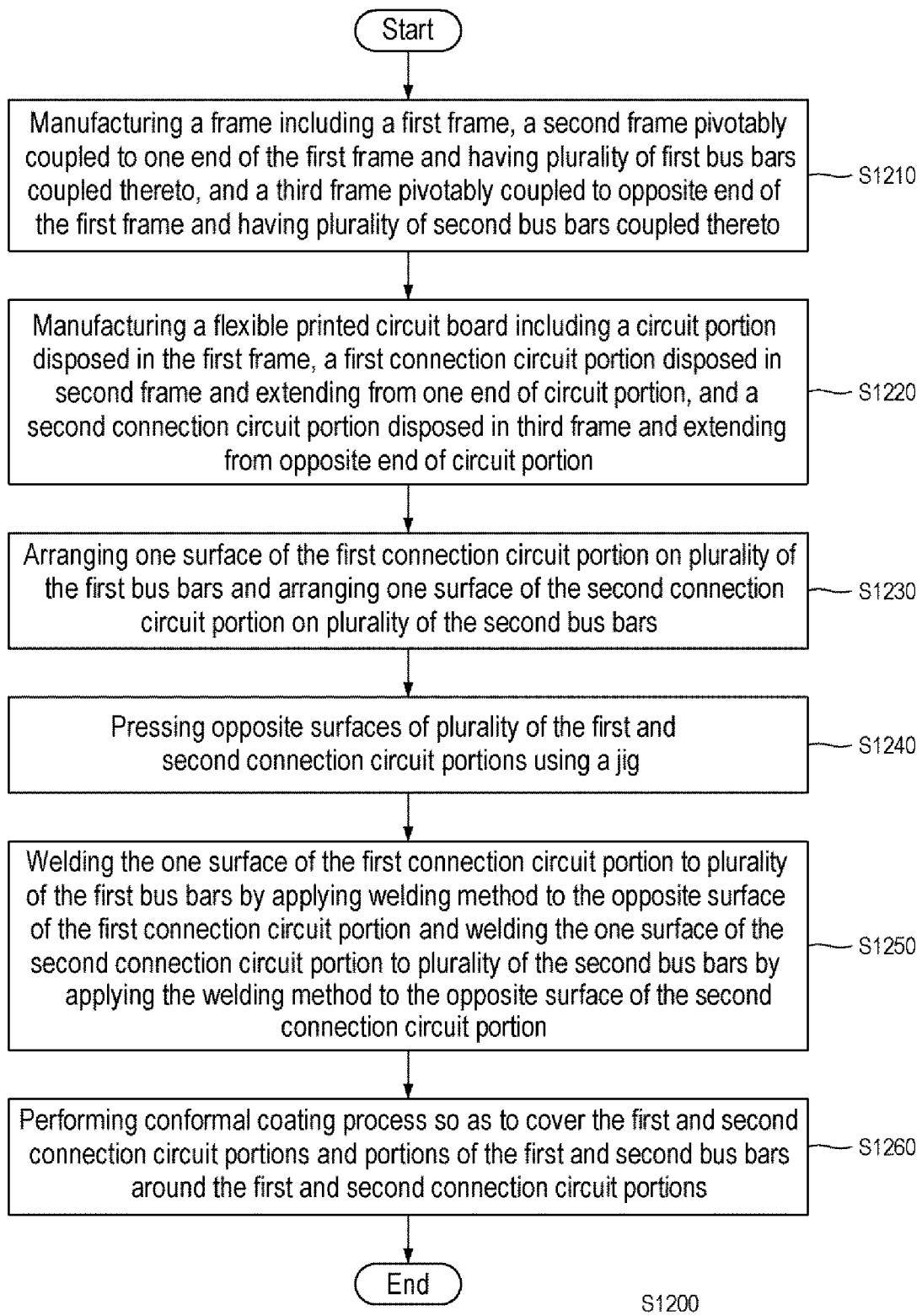
FIG. 18 is a flowchart showing a method of manufacturing a frame assembly according to an eighth embodiment.

FIG. 18 is a flowchart showing a method of manufacturing a frame assembly (S1200) according to an eighth embodiment. Descriptions the same as those of the above-described embodiments will be omitted.

The method of manufacturing a frame assembly (S1200) may include a step of manufacturing a frame including a first frame, a second frame pivotably coupled to one end of the first frame and having a plurality of first bus bars coupled thereto, and a third frame pivotably coupled to the opposite end of the first frame and having a plurality of second bus bars coupled thereto (S1210), a step of manufacturing a flexible printed circuit board including a circuit portion provided in the first frame, a first connection circuit portion provided in the second frame and extending from one end of the circuit portion, and a second connection circuit portion provided in the third frame and extending from the opposite end of the circuit portion (S1220), a step of disposing one surface of the first connection circuit portion on a plurality of first bus bars and disposing one surface of the second connection circuit portion on a plurality of second bus bars (S1230), and a step of welding the one surface of the first connection circuit portion to the plurality of first bus bars by applying a welding method to the opposite surface of the first connection circuit portion and welding the one surface of the second connection circuit portion to the plurality of second bus bars by applying a welding method to the opposite surface of the second connection circuit portion (S1250).

In an embodiment, the method of manufacturing the assembly (S1200) may further include a step of pressing the opposite surfaces of the plurality of first and second connection circuit portions using a jig (S1240) and a step of performing a conformal coating process so as to cover the first and second connection circuit portions and portions of the first and second bus bars around the first and second connection circuit portions, respectively (S1260).

Figure 19:
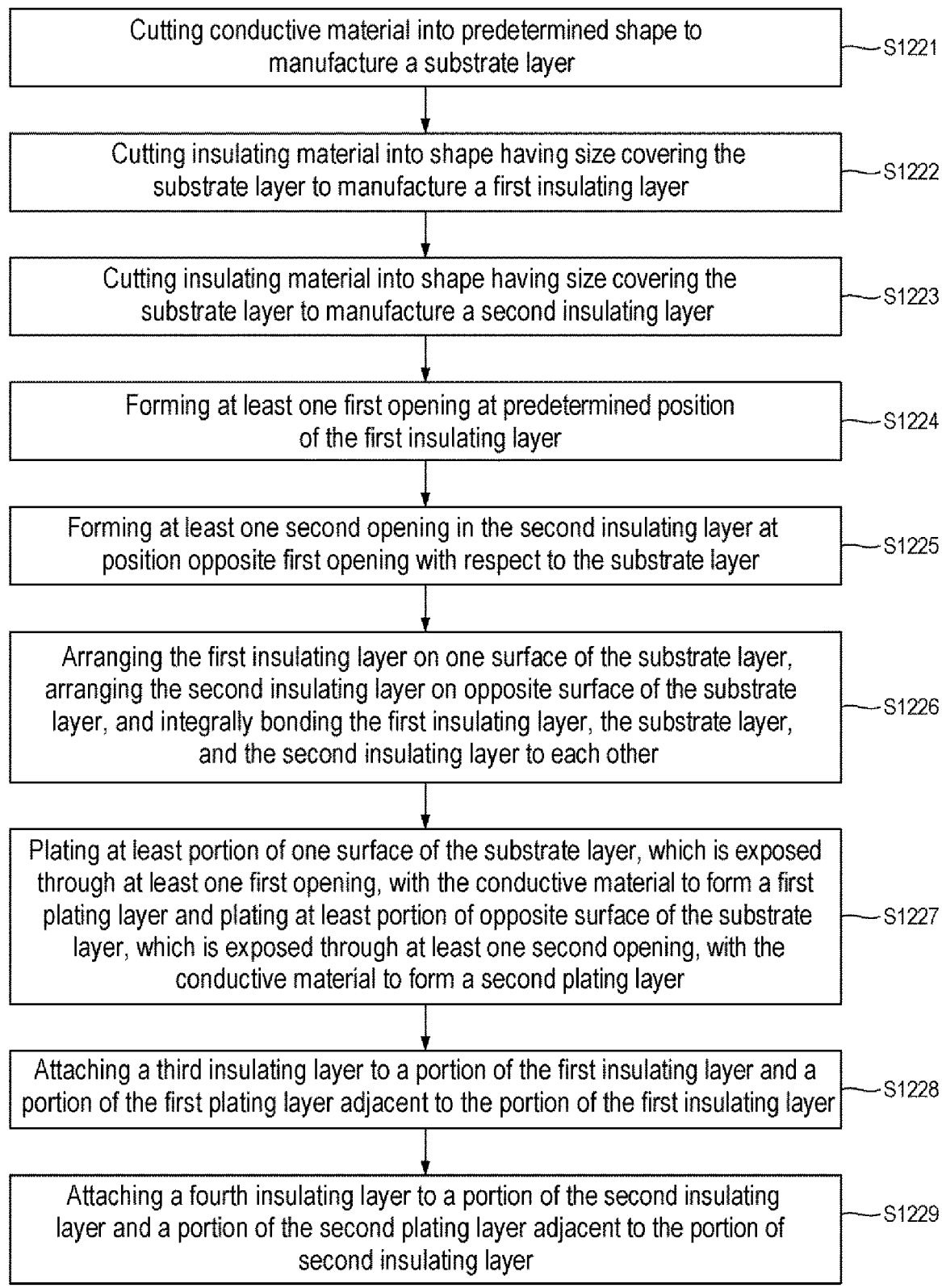
FIG. 19 is a flowchart showing steps of manufacturing a flexible printed circuit board in the method of manufacturing the frame assembly shown in FIG. 18.

FIG. 19 is a flowchart showing the step of manufacturing a flexible printed circuit board (S1220) in the method of manufacturing the frame assembly (S1200) shown in FIG. 18.

The step of manufacturing a flexible printed circuit board (S1220) may include a step of cutting a conductive material into a predetermined shape to manufacture a substrate layer (S1221), a step of cutting an insulating material into a shape having a size covering the substrate layer to manufacture a first insulating layer (S1222), a step of cutting an insulating material into a shape having a size covering the substrate layer to manufacture a second insulating layer (S1223), a step of forming at least one first opening at a predetermined position of the first insulating layer (S1224), a step of forming at least one second opening in the second insulating layer at a position opposite the first opening with respect to the substrate layer (S1225), and a step of disposing the first insulating layer on one surface of the substrate layer and disposing the second insulating layer on the opposite surface of the substrate layer and integrally bonding the first insulating layer, the substrate layer, and the second insulating layer to each other (S1226).

In an embodiment, the step of manufacturing a flexible printed circuit board (S1220) may include a step of plating at least a portion of one surface of the substrate layer, which is exposed through at least one first opening, with a conductive material to form a first plating layer and plating at least a portion of the opposite surface of the substrate layer, which is exposed through at least one second opening, with a conductive material to form a second plating layer (S1227), a step of attaching a third insulating layer to a portion of the first insulating layer and a portion of the first plating layer adjacent to the portion of the first insulating layer (S1228), and a step of attaching a fourth insulating layer to a portion of the second insulating layer and a portion of the second plating layer adjacent to the portion of the second insulating layer (S1229).

Although the steps of processes, the steps of methods, algorithms, and the like have been described as being performed in sequence in the flowcharts shown in FIGS. 18 and 19, the processes, the methods, and the algorithms may be configured to be performed in any arbitrary or suitable sequence. In other words, the steps of the processes, methods, and algorithms described in various embodiments of the present disclosure need not be performed in the order described in the present disclosure. In addition, although some steps are described as not being performed simultaneously, the some steps may be performed simultaneously in other embodiments. Further, the processes illustrated in the drawings are not intended to exclude variations and modifications of the processes; some of the illustrated processes or steps thereof are not intended to be essential to one or more of the various embodiments of the present disclosure; and the illustrated processes are not intended to mean that only those processes are preferable.

The technical idea of the present disclosure has been described heretofore with reference to some embodiments and examples shown in the accompanying drawings. However, it is to be understood that various substitutions, modifications and alterations may be made without departing from the technical idea and scope of the present disclosure, which may be understood by those of ordinary skill in the technical field to which the present disclosure pertains.

Further, it is to be understood that such substitutions, modifications and alterations fall within the scope of the appended claims.

What is claimed is:

1. A frame assembly for fixing a plurality of stacked battery cells, the frame assembly comprising:
a frame including an upper surface, a first side surface connected to a first end of the upper surface and a second side surface connected to a second end of the upper surface, the frame being configured to enclose the plurality of stacked battery cells;
a plurality of first bus bars coupled to the first side surface;
a plurality of second bus bars coupled to the second side surface; and
a flexible printed circuit board disposed along the upper surface, the first side surface, and the second side surface of the frame, the flexible printed circuit board being configured to sense the plurality of stacked battery cells,
wherein the flexible printed circuit board comprises:
a circuit portion disposed on the upper surface;
a first connection circuit portion disposed on the first side surface, the first connection circuit portion extending from a first end of the circuit portion and coupled to the plurality of first bus bars; and
a second connection circuit portion disposed on the second side surface, the second connection circuit portion extending from a second end of the circuit portion and coupled to the plurality of second bus bars,
wherein each of the first and second connection circuit portions comprises:
a substrate layer made of a flexible material;
a first insulating layer disposed on a first surface of the substrate layer and having at least one first opening formed therein so as to expose the first surface of the substrate layer; and
a second insulating layer disposed on a second surface of the substrate layer and having at least one second opening formed at a position opposite the at least one first opening with respect to the substrate layer so as to expose the second surface of the substrate layer,
wherein the exposed second surface of the substrate layer of the first connection circuit portion is disposed to be adjacent to the first bus bars, and bonded to the first bus bars by applying a bonding method to the first surface of the substrate layer of the first connection circuit portion, and
wherein the exposed second surface of the substrate layer of the second connection circuit portion is disposed to be adjacent to the second bus bars, and bonded to the second bus bars by applying the bonding method to the first surface of the substrate layer of the second connection circuit portion.

2. The frame assembly of claim 1, wherein the frame comprises:
a first frame forming the upper surface;
a second frame forming the first side surface and pivotably coupled to a first end of the first frame, the plurality of first bus bars being disposed on the second frame; and
a third frame forming the second side surface and pivotably coupled to a second end of the first frame, the plurality of second bus bars being disposed on the third frame.

3. The frame assembly of claim 1, wherein the plurality of first bus bars comprise a first recess configured to seat the first connection circuit portion therein, and the plurality of second bus bars comprise a second recess configured to seat the second connection circuit portion therein.

4. The frame assembly of claim 1, wherein, in a state in which the first connection circuit portion is bonded to the first bus bars, a conformal coating process is performed so as to cover the first connection circuit portion and some of the first bus bars in a vicinity of the first connection circuit portion, and
wherein, in a state in which the second connection circuit portion is bonded to the second bus bars, a conformal coating process is performed so as to cover the second connection circuit portion and some of the second bus bars in a vicinity of the second connection circuit portion.

5. The frame assembly of claim 1, wherein the at least one second opening is formed to be larger than the at least one first opening, and a portion of the first insulating layer partially overlaps an area in which the at least one second opening is formed in a cross section of the first and second connection circuit portions.

6. The frame assembly of claim 1, wherein each of the first and second connection circuit portions comprises a first plating layer plated to cover at least a portion of the first surface, and a second plating layer plated to cover at least a portion of the second surface.

7. The frame assembly of claim 6, wherein thicknesses of the first and second plating layers correspond to thicknesses of the first and second insulating layers, respectively.

8. The frame assembly of claim 6, wherein each of the first and second connection circuit portions further comprises:
a third insulating layer attached to a portion of the first insulating layer and to a portion of the first plating layer adjacent to the portion of the first insulating layer; and
a fourth insulating layer attached to a portion of the second insulating layer and to a portion of the second plating layer adjacent to the portion of the second insulating layer.

9. The frame assembly of claim 8, wherein the third insulating layer is attached to be in close contact with a position where the first insulating layer and the first plating layer are in contact with each other, and
the fourth insulating layer is attached to be in close contact with a position where the second insulating layer and the second plating layer are in contact with each other.

10. The frame assembly of claim 8, wherein an end of the fourth insulating layer is disposed to be in contact with ends of the first and second bus bars.

11. The frame assembly of claim 1, wherein each of the first and second connection circuit portions further comprises a third insulating layer disposed on the first insulating layer and having at least one third opening formed therein at a position corresponding to the at least one first opening.

12. A frame assembly manufacturing method of manufacturing the frame assembly of claim 1, the frame assembly manufacturing method comprising:
manufacturing the frame
manufacturing the flexible printed circuit board
bonding of the first connection circuit portion to the plurality of first bus bars; and
bonding the first surface of the second connection circuit portion to the plurality of second bus bars,
wherein the manufacturing the flexible printed circuit board comprises:
manufacturing the substrate layer by cutting a flexible conductive material into a predetermined shape;
manufacturing the first insulating layer disposed on the first surface of the substrate layer by cutting an insulating material into a shape having a size that covers the substrate layer;
manufacturing the second insulating layer disposed on the second surface of the substrate layer by cutting the insulating material into a shape having a size that covers the substrate layer;
forming, in each of the first and second connection circuit portions, the at least one first opening in the first insulating layer at a predetermined position so as to expose the first surface of the substrate layer;
forming, in each of the first and second connection circuit portions, the at least one second opening in the second insulating layer at a position opposite the at least one first opening with respect to the substrate layer so as to expose the second surface of the substrate layer; and
disposing the first insulating layer on the first surface of the substrate layer, disposing the second insulating layer on the second surface of the substrate layer, and integrally coupling the first insulating layer, the substrate layer, and the second insulating layer,
wherein the bonding the first connection circuit portion to the plurality of first bus bars comprises: disposing the exposed second surface of the substrate layer of the first connection circuit portion to be adjacent to the first bus bars; and bonding the exposed second surface of the substrate layer of the first connection circuit portion to the first bus bars by applying the bonding method to the first surface of the substrate layer of the first connection circuit portion, and
wherein the bonding the second connection circuit portion to the plurality of second bus bars comprises: disposing the exposed second surface of the substrate layer of the second connection circuit portion to be adjacent to the second bus bars; and bonding the exposed second surface of the substrate layer of the second connection circuit portion to the second bus bars by applying the bonding method to the first surface of the substrate layer of the second connection circuit portion.

13. The frame assembly manufacturing method of claim 12, further comprising:
pressing the first surfaces of the first and second connection circuit portions using a jig.

14. The frame assembly manufacturing method of claim 12, further comprising:
performing a conformal coating process to cover the first and second connection circuit portions and some of the first and second bus bars in a vicinity of each of the first and second connection circuit portions.

15. The frame assembly manufacturing method of claim 12, wherein the manufacturing the flexible printed circuit board further comprises:
forming a first plating layer by plating the conductive material on at least a portion of the first surface of the substrate layer exposed through the at least one first opening, and forming a second plating layer by plating a conductive layer on at least a portion of the second surface of the substrate layer exposed through the at least one second opening.

16. The frame assembly manufacturing method of claim 15, wherein the manufacturing the flexible printed circuit board further comprises:
attaching a third insulating layer to a portion of the first insulating layer and to a portion of the first plating layer adjacent to the portion of the first insulating layer; and attaching a fourth insulating layer to a portion of the second insulating layer and to a portion of the second plating layer adjacent to the portion of the second insulating layer.

* * * * *